(12) United States Patent
Kimura et al.

(10) Patent No.: US 7,164,610 B2
(45) Date of Patent: Jan. 16, 2007

(54) MICROCOMPUTER HAVING A FLUSH MEMORY THAT CAN BE TEMPORARILY INTERRUPTED DURING AN ERASE PROCESS

(75) Inventors: Hiroyuki Kimura, Tokyo (JP); Kunio Tani, Tokyo (JP); Tetsu Tashiro, Tokyo (JP); Makoto Yamamoto, Tokyo (JP); Toshihiro Sezaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 74 days.

(21) Appl. No.: 10/323,771

(22) Filed: Dec. 20, 2002

(65) Prior Publication Data

US 2004/0003167 A1 Jan. 1, 2004

(30) Foreign Application Priority Data

Jun. 27, 2002 (JP) .............................. 2002-188397

(51) Int. Cl.
*G06F 9/312* (2006.01)

(52) U.S. Cl. ................. 365/195; 365/218; 365/185.29; 365/189.01; 365/185.33; 710/260; 711/103; 711/167

(58) Field of Classification Search ................ 711/103, 711/167; 365/185.29, 185.33
See application file for complete search history.

(56) References Cited

U.S. PATENT DOCUMENTS

| 5,355,464 | A | * | 10/1994 | Fandrich et al. ............. 365/218 |
| 5,805,501 | A | * | 9/1998 | Shiau et al. ............ 365/185.29 |
| 6,381,175 | B1 | * | 4/2002 | Pitts ...................... 365/185.11 |
| 6,598,137 | B1 | * | 7/2003 | Yaegawa et al. ............ 711/165 |
| 6,633,950 | B1 | * | 10/2003 | Brown et al. ................ 711/103 |
| 2001/0050860 | A1 | * | 12/2001 | Kato et al. ............. 365/185.11 |
| 2001/0050880 | A1 | * | 12/2001 | Kato et al. ............. 365/185.11 |

FOREIGN PATENT DOCUMENTS

| JP | 02-257496 | 10/1990 |
| JP | 11-250674 | 9/1999 |

* cited by examiner

*Primary Examiner*—B. James Peikari
(74) *Attorney, Agent, or Firm*—Buchanan Ingersoll & Rooney PC

(57) ABSTRACT

A microcomputer with a built-in non-volatile semiconductor memory, which can automatically perform a work of temporarily interrupting automatic writing or automatic erase and accepting an interruption process when an interruption occurs during the automatic writing or automatic erase by using an interrupt request signal for a microcomputer as an external input for controlling automatic writing or automatic erase of a flash memory.

5 Claims, 16 Drawing Sheets

SUSPEND CONTROL REGISTER
IN INTERFACE CIRCUIT 3

| SUSPEND REQUEST REGISTER 7 | 0: RESTART AUTOMATIC ERASE/AUTOMATIC WRITE (NO SUSPEND REQUEST)<br>1: THERE IS SUSPEND REQUEST |
|---|---|
| SUSPEND ENABLE REGISTER 8 | 0: SUSPENSE MODE INVALID<br>1: SUSPENSE MODE VALID |

FIG.5

| COMMAND | NUMBER OF CYCLES | FIRST BUS CYCLE | | | SECOND BUS CYCLE | | |
| --- | --- | --- | --- | --- | --- | --- | --- |
| | | MODE | ADDRESS | DATA | MODE | ADDRESS | DATA |
| READ | 1 | WRITE | X | FFH | | | |
| STATUS REGISTER READ | 2 | WRITE | X | 70H | READ | X | SRD |
| STATUS REGISTER CLEAR | 1 | WRITE | X | 50H | | | |
| AUTOMATIC WRITE | 2 | WRITE | X | 40H | WRITE | WA | WD |
| AUTOMATIC COLLECTIVE ERASE | 2 | WRITE | X | 20H | WRITE | X | 20H |
| AUTOMATIC BLOCK ERASE | 2 | WRITE | X | 20H | WRITE | BA | D0H |

IA: ID CODE ADDRESS, ID: ID CODE DATA, SRD: STATUS REGISTER DATA,
WA: WRITE ADDRESS, WD: WRITE DATA, BA: BLOCK ADDRESS,
BA1: BLOCK START ADDRESS, BA2: BLOCK END ADDRESS

SUSPEND POSITION SETTING REGISTER b0 : 0 NO SUSPEND SET (DEFAULT)
: 1 SUSPEND AFTER WRITE-BEFORE-ERASE ENDS b1 : 0 NO SUSPEND SET (DEFAULT)
: 1 SUSPEND AFTER ERASE PULSE APPLICATION b2 : 0 NO SUSPEND SET (DEFAULT)
: 1 SUSPEND AFTER WRITE PULSE APPLICATION

MICROCOMPUTER HAVING A FLUSH MEMORY THAT CAN BE TEMPORARILY INTERRUPTED DURING AN ERASE PROCESS

BACKGROUND OF THE INVENTION

1. Field of the Invention

The present invention relates to a microcomputer incorporating an electrically reprogrammable non-volatile memory (non-volatile semiconductor memory), such as a flash memory, and, more particularly, to the functions of a non-volatile memory (hereinafter referred as "flash memory" as a typified type) at the time of rewriting the flash memory.

2. Description of the Prior Art

During the automatic write sequence and automatic erase sequence of a flash memory, generally data in the memory cannot be read out. In case of a microcomputer with a built-in flash memory, an execution program needs to be stored in a memory other than the flash memory, such as an internal RAM, at the time of writing or erasing of the flash memory. Even in case of performing writing or erase from an execution program in the flash memory, the CPU cannot fetch a next code until the automatic sequence is completed. This requires that the operation of the microcomputer be stopped temporarily.

For example, a microcomputer with a built-in NOR type flash memory takes a maximum of about several seconds for erasure, during which the CPU cannot access the flash memory. If an erase is executed from a program in a ROM, therefore, the CPU should be set in a hold state or the like until the erase is finished and cannot therefore accept an external interruption at all over a long period of time.

JP-A 02-257496(1990) discloses a microcomputer which, upon generation of a write interruption request while an erase/write voltage VPP is applied, stops and holds the count value of a timer and raises a voltage VPP temporarily to perform a process, such as reading, then raises the voltage VPP again and resumes application of the voltage from the count value held.

Because the conventional microcomputer with a built-in non-volatile memory has the above-described architecture, automatic erase requires about several seconds at the maximum. In a case where automatic erase is carried out from a program in the ROM, therefore, the microcomputer cannot fetch a next program code in the flash memory during that period of time. Once automatic erase is executed, the microcomputer should be disabled until the automatic erase is completed to permit a read operation. Even in a case where an interruption request is generated from a peripheral circuit or an external unit, the sequence from the generation of the interruption request to the point at which the execution of the interruption may take about several seconds at the maximum in some cases when the interruption vector is set at an address in the flash memory.

In a case where one cannot wait until automatic erase is completed, resetting should be enabled forcibly to interrupt the process of automatic collective erase or automatic block erase, followed by reading of memory data. In a case where resetting is enabled to interrupt the process of automatic collective or full erase or automatic block erase after which memory data is read out, therefore, automatic collective erase or automatic block erase must be executed from the beginning after memory data is read out.

SUMMARY OF THE INVENTION

The present invention has been made to overcome the above-described problems. It is therefore an object to obtain a microcomputer with a built-in non-volatile memory which has a capability of temporarily interrupting and resuming the process of automatic writing and automatic erase in response to an input made externally (from outside the microcomputer) during automatic writing and automatic erase.

A microcomputer according to the invention comprises at least a CPU capable of executing an automatic erase sequence and automatic write sequence provided in the microcomputer; a non-volatile memory whose automatic erase and automatic writing can be interrupted and resumed under external control; and a peripheral device, whereby the automatic erase or automatic writing of the non-volatile memory is temporarily interrupted in response to an interruption request from the peripheral device or outside, so that the CPU can read data from the non-volatile memory, and an interruption request for the microcomputer is used as a trigger to interrupt automatic erase of the non-volatile memory, such as a flash memory. When an interruption is made by the CPU during an erase cycle, for example, the non-volatile memory such as a flash memory proceeds a sequence to a point where erase is interruptible and then temporarily interrupts the erase process to enable only reading from a ROM (erase/writing prohibited). The flash memory is provided beforehand with places where a sequence can be interrupted.

As apparent from the above, the microcomputer according to the invention is designed in such a way that automatic erase or automatic writing of the non-volatile memory is temporarily interrupted by an interruption request from a peripheral device or outside the microcomputer so that the CPU can read data from the memory. When an interruption occurs during automatic writing or automatic erase, therefore, it is possible to automatically execute a work of temporarily interrupting automatic erase and accepting the interruption process. This brings about such an advantage that even in a case where memory data needs to be read during execution of automatic erase of the non-volatile memory, it is unnecessary to wait for the erase process is completed or enable resetting.

BRIEF DESCRIPTION OF THE DRAWINGS

FIG. 5 is a diagram showing a list of operation modes of the non-volatile semiconductor memory in accordance with the first embodiment of the invention;

DETAILED DESCRIPTION OF THE PREFERRED EMBODIMENTS

An embodiment of the present invention will be described below.

First Embodiment

Figure 1:
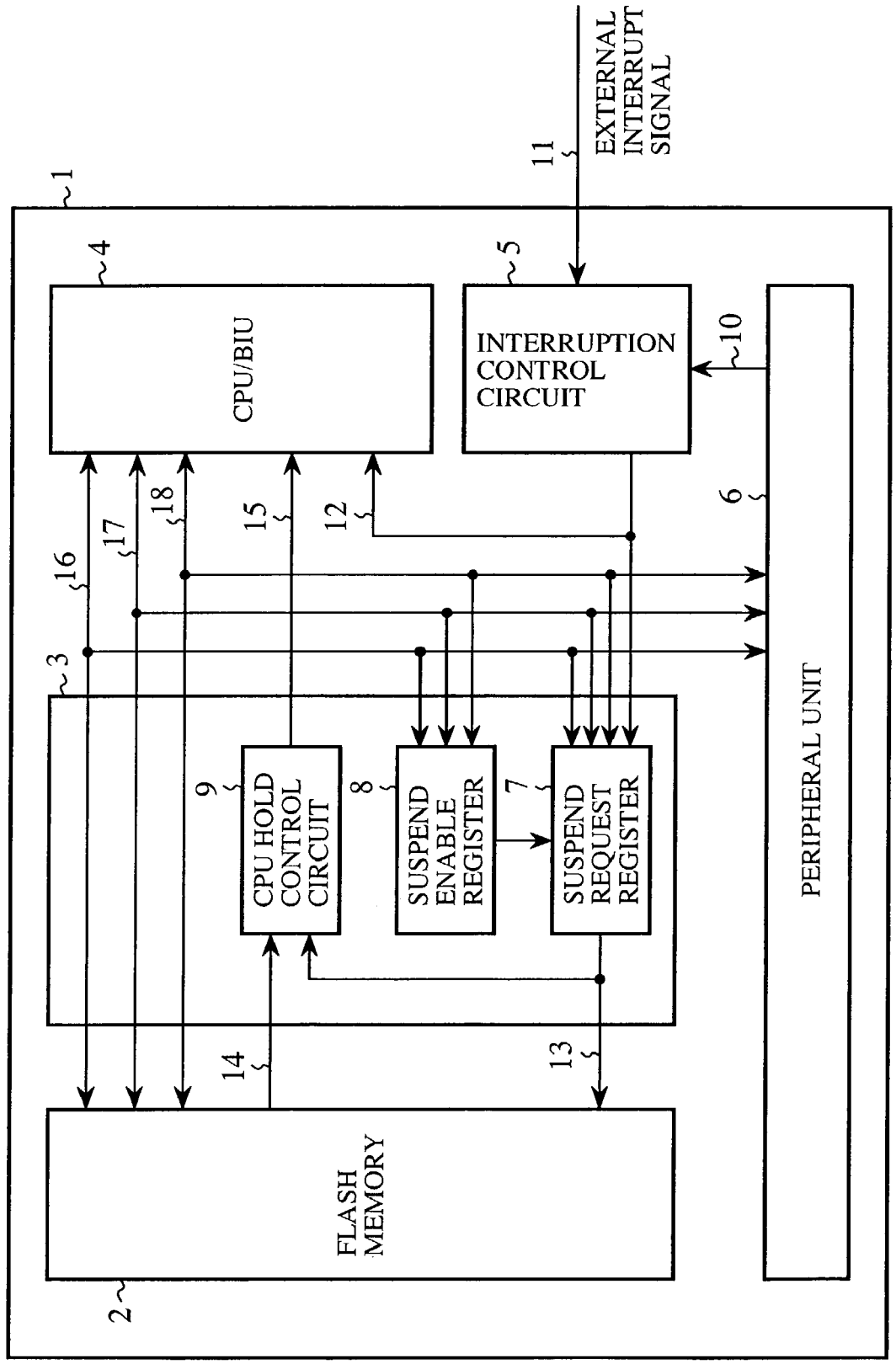
FIG. 1 is a block diagram illustrating the structure of a microcomputer with a built-in flash memory in accordance with a first embodiment of the invention.

FIG. 1 is a block diagram illustrating the general structure of a microcomputer with a built-in flash memory according to a first embodiment of the invention. In FIG. 1, reference numeral "1" denotes a flash-memory incorporating microcomputer. The microcomputer 1 has a flash memory 2 as a non-volatile memory, an interface circuit 3 between the flash memory 2 and the microcomputer section, a central processing unit (CPU) and a bus interface unit (BIU) (hereinafter abbreviated as "CPU/BIU") 4, an interruption control circuit 5, and peripheral unit (peripheral device) 6, such as a RAM, timer, a serial communication circuit or a port control block, which also constitutes the microcomputer. A suspend request register 7, a suspend enable register 8 and a CPU hold control circuit 9 are located in the interface circuit 3.

A peripheral-unit interrupt signal 10 and an external interrupt signal 11 are input to the interruption control circuit 5 from the peripheral unit 6 and outside the microcomputer, respectively. Reference numeral "12" denotes an interrupt request signal 12 from the interruption control circuit 5, which is input to the CPU/BIU 4 and the interface circuit 3. Reference numerals "13", "14", "15", "16" and "17" respectively denote a suspend request signal, a suspend accept signal, a CPU hold signal, an address bus and a data bus. The result of ANDing the output of the suspend enable register 8 in the interface circuit 3 and the output of the suspend request register 7 becomes the erase interrupt request (hereinafter called "suspend request") signal 13 to the flash memory 2.

Figures 2, 4:
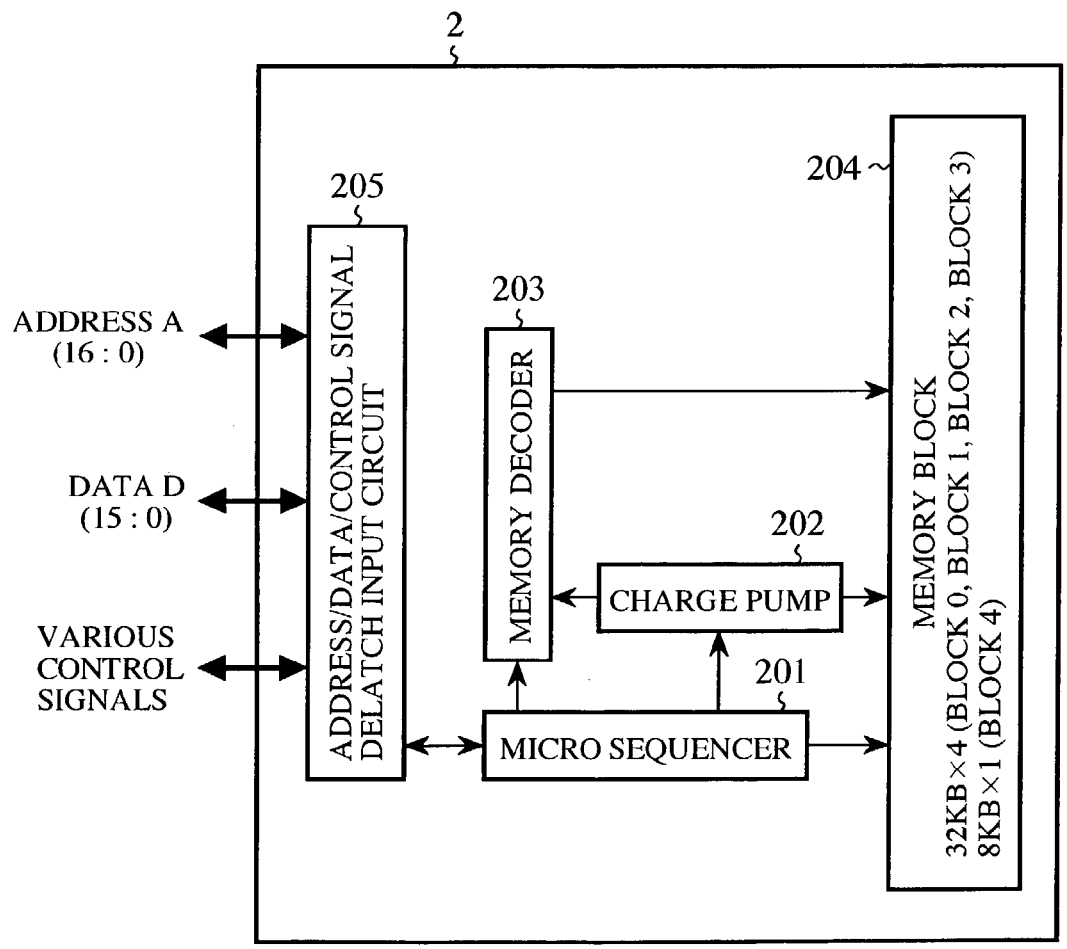
FIG. 2 is a diagram illustrating the structure of a suspend control register.
FIG. 4 is a diagram showing functional blocks of a non-volatile semiconductor memory in accordance with the first embodiment of the invention.

FIG. 2 illustrates the functions of the suspend request register 7 and the suspend enable register 8.

An interruption request to the microcomputer herein means an interruption request to a program execution operation of the CPU which is included in an ordinary microcomputer. While the ordinary microcomputer sequentially executes commands at program addresses, the microcomputer interrupts the sequential operation and executes a program at a specific (designated) address, when an interruption request is generated from an external input or the peripheral unit.

The structure of the flash memory 2 will now be discussed below.

FIG. 4 is a block diagram showing the general structure of the non-volatile semiconductor memory according to the first embodiment of the invention. Referring to the diagram, the flash memory 2 or the non-volatile semiconductor memory comprises a micro sequencer 201, a charge pump 202, a memory decoder 203, a memory block 204 and an address/data/control signal delatch input circuit 205. An address A (16:0), a data D (15:0) and various control signals are input from and output to outside the memory.

FIG. 5 shows a list of operation modes of the non-volatile semiconductor memory according to the invention.

The individual operation modes will now be discussed. The read mode reads data at a given address in the non-volatile semiconductor memory.

The status register read mode reads status information for automatic erase/automatic writing. The operation enters the status register read mode in response to a command 70H input from the data D (15:0) bus and returns in response to a command FFH.

The status register clear mode clears the contents of a status register. The operation enters the status register clear mode in response to a command 50H input from the data D (15:0) bus and returns in response to the command FFH.

In the automatic write, the operation enters a setup mode in response to a command 40H input from the data D (15:0) bus and acquires write data and write address in the next cycle to enter the automatic write mode. After the automatic write mode is completed, a write status is written in the status register.

In the automatic collective erase, the operation enters the setup mode in response to a command 20H input from the data D (15:0) bus and enters the automatic collective erase mode in response to the verify command 20H in the next cycle. After the automatic collective erase mode is completed, a collective erase status is written in the status register.

In the automatic block erase, the operation enters the setup mode in response to the command 20H input from the data D (15:0) bus and acquires a D0H/block address in the next cycle to enter the automatic block erase mode. After the first automatic block erase, a write status is written in the status register.

Figure 6:
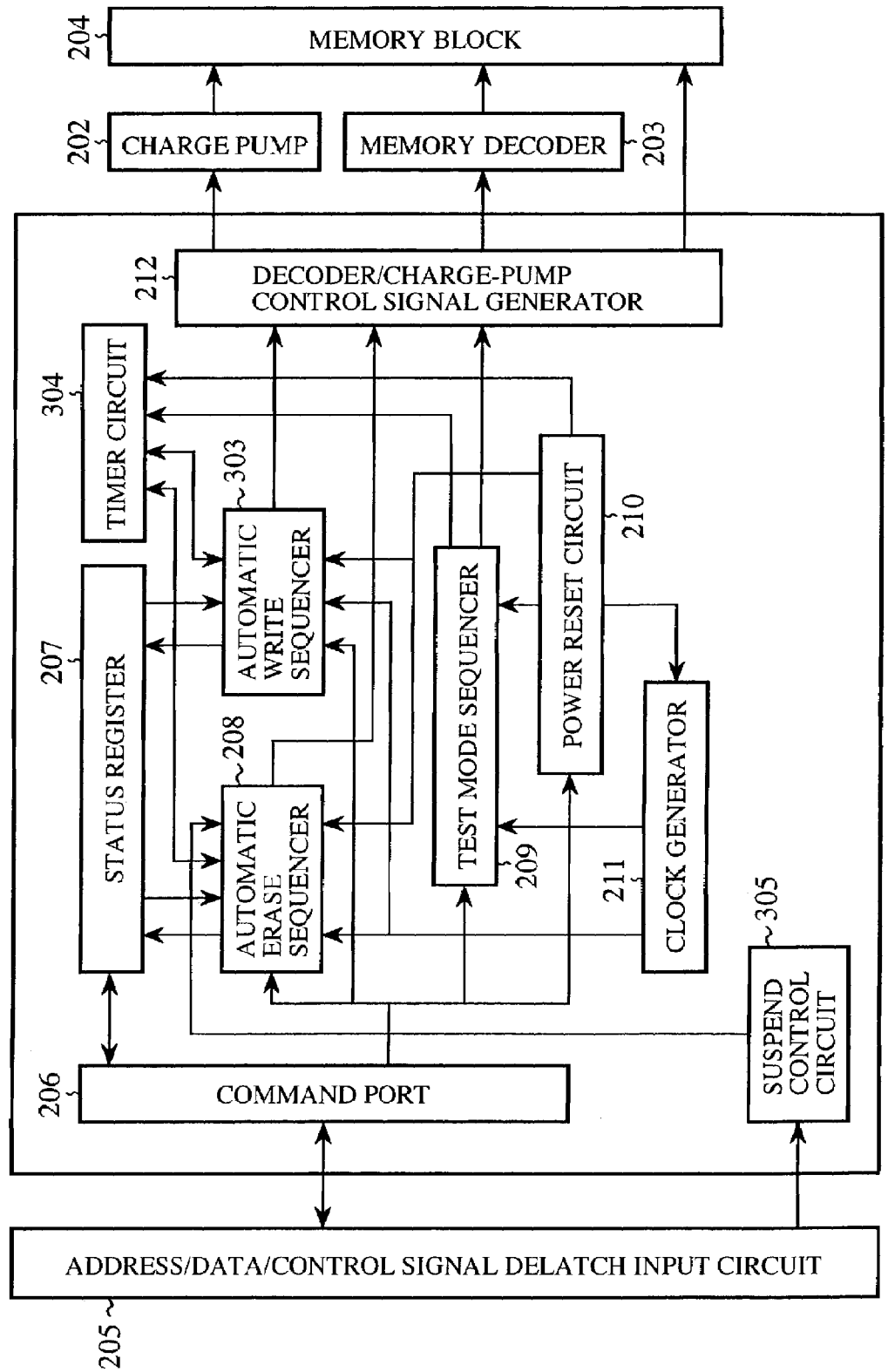
FIG. 6 is a diagram showing functional blocks of a micro sequencer in the functional blocks shown in FIG. 4.

FIG. 6 presents a block diagram of the micro sequencer 201. Referring to the diagram, the micro sequencer 201 includes a command port 206, a status register 207, an automatic erase sequencer 208, an automatic write sequencer 303, a test mode sequencer 209, a power reset circuit 210, a clock generator 211, a decoder/charge-pump control signal generator 212, a timer circuit 304 and a suspend control circuit 305.

Referring to FIG. 5, the command port 206 sets various modes and controls the charge pump 202, the memory decoder 203 and the memory block 204 based on information sent from the address/data/control signal delatch input circuit 205. At the time of execution of the second automatic block erase, the address latch circuit latches an erase memory block start address in a first bus cycle and latches an erase memory block end address in a second bus cycle. At the time of execution of the first automatic block erase, the address latch circuit latches the block address of the erase memory block in the second bus cycle.

The erase memory block start address and the erase memory block end address that have been latched at the time of execution of the second automatic block erase are used at the time of executing pre-erase writing and erase-verify in the second automatic block erase sequence.

The automatic erase sequencer 208 controls the automatic erase operation in response to an instruction from the command port 206.

The charge pump 202, the memory decoder 203 and the memory block 204 are controlled via the decoder/charge-pump control signal generator 212. Measuring various times needed in the automatic erase sequence, such as the time for generating an erase pulse and a pump activating time, is carried out by activating the timer circuit 304. The status at the time of automatic erase is written in the status register 207.

The automatic write sequencer 303 controls the automatic write operation in response to an instruction from the command port 206. The charge pump 202 and the memory decoder 203 are controlled via the decoder/charge-pump control signal generator 212. Measuring various times needed in the automatic write sequence, such as the time for generating a write pulse and a pump activating time, is carried out by activating the timer circuit 304. The status at the time of automatic writing is written in the status register 207.

The test mode sequencer 209 controls the test mode operation in response to an instruction from the command port 206. The charge pump 202, the memory decoder 203 and the memory block 204 are controlled via the decoder/charge-pump control signal generator 212. Measuring various times needed in various test sequences, such as the times for generating a write pulse and an erase pulse and a pump activating time, is carried out by activating the timer circuit 304.

The power reset circuit 210 sends a reset signal to an internal circuit upon detection of the rising edge of a supply voltage or resets all the internal circuits in response to an external reset signal input via the command port 206.

The clock generator 211 sends a clock pulse of 10 MHz to the automatic erase sequencer 208, the automatic write sequencer 303 and the test mode sequencer 209.

When all the circuits are disabled by the power reset circuit 210, the clock generator 211 also stops functioning, thus stopping the clock signal.

The status register 207 holds the status at the time of automatic erase or automatic writing and sends out its value, when needed, via the command port 206.

Upon reception of the output of the test mode sequencer 209, the decoder/charge-pump control signal generator 212 generates control signals for controlling the charge pump 202, the memory decoder 203 and the memory block 204.

The timer circuit 304 measures a time requested upon reception of signals from the automatic erase sequencer 208, the automatic write sequencer 303 and the test mode sequencer 209, and returns an end signal to the requesting block.

The suspend control circuit 305 accepts a suspend request, made externally, via the address/data/control signal delatch input circuit 205. The suspend request requests the automatic erase sequencer 208 to interrupt a process via the suspend control circuit 305.

Figure 7:
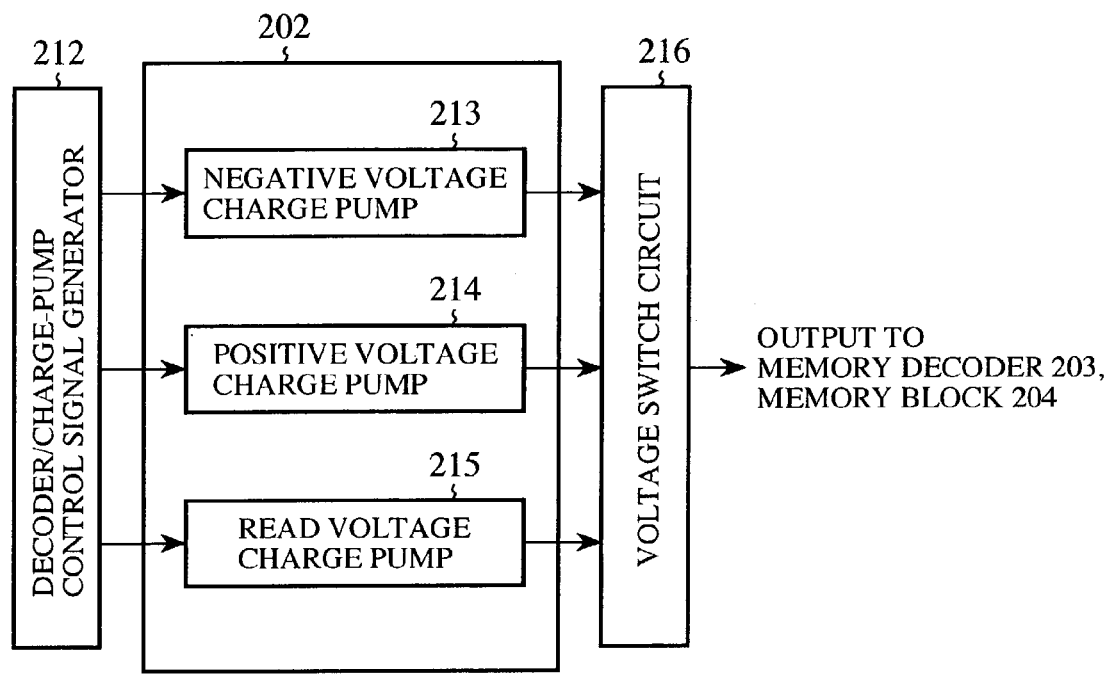
FIG. 7 is a diagram showing functional blocks of a charge pump in the functional blocks shown in FIG. 4.

FIG. 7 presents a block diagram of the charge pump 202. Referring to the diagram, the charge pump 202 includes a negative voltage charge pump 213, a positive voltage charge pump 214 and a read voltage charge pump 215.

The charge pump 202 is controlled by the micro sequencer 201, and the outputs of the individual charge pumps 213 to 215 are supplied to the memory decoder 203 and the memory block 204 by a voltage switch circuit 216.

The negative voltage charge pump 213, which is a negative charge pump for erase, generates a negative voltage at the time of automatic erase.

The positive voltage charge pump 214, which is a positive charge pump for write/erase, generates a positive voltage at the time of write and erase.

The read voltage charge pump 215, which is a positive charge pump for read/verify, generates a read voltage at the time of read operations and generates a verify-read voltage at the time of write/write-verify operations.

Figure 8:
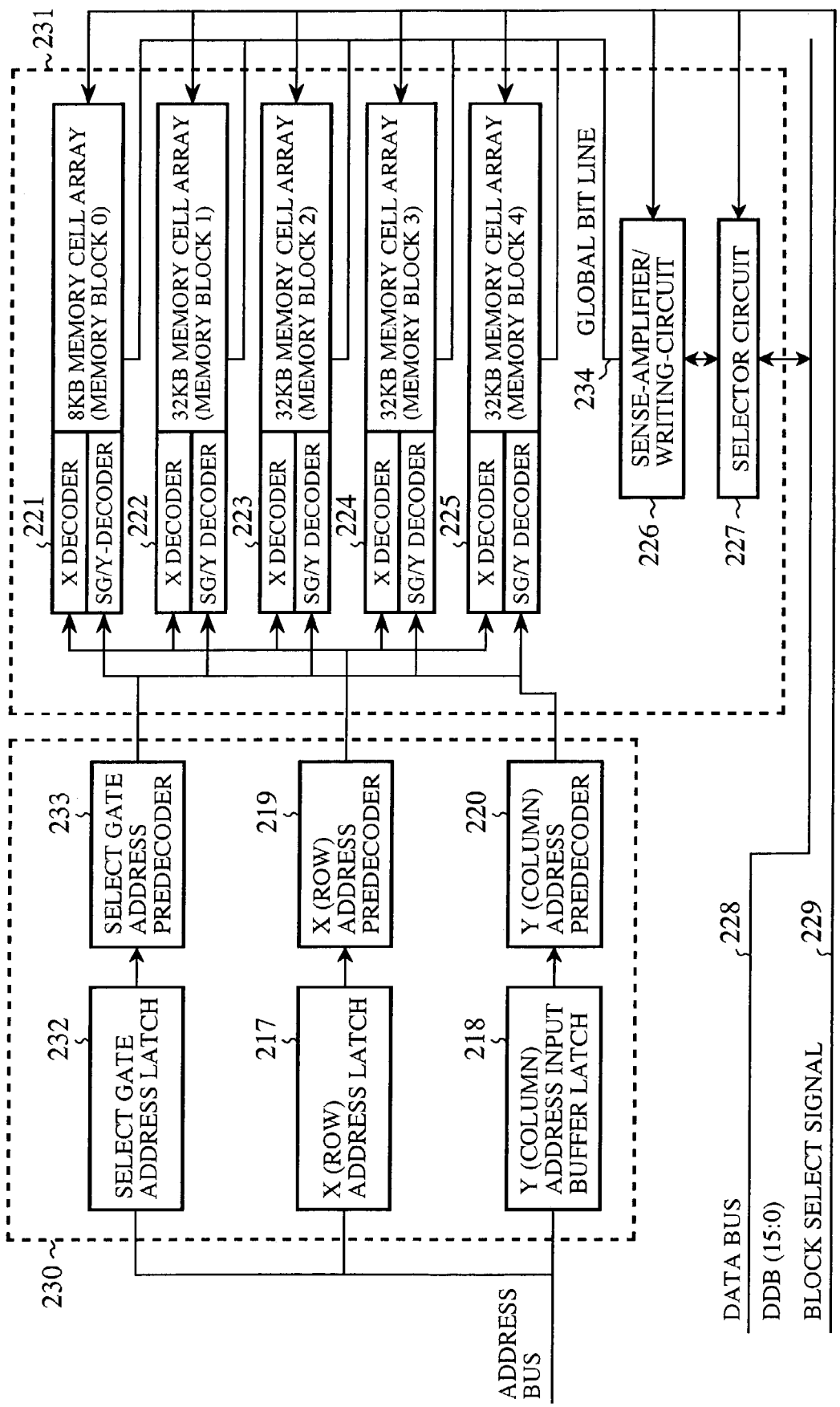
FIG. 8 is a diagram showing functional blocks of a memory decoder and a memory block in the functional blocks shown in FIG. 4.

FIG. 8 shows the structure of a memory decoder 230 in the memory block 204. Referring to the diagram, the memory decoder 230 includes a Y (column) address input buffer latch 218, an X (row) address latch 217, a Y (column) address predecoder 220, an X (row) address predecoder 219, a select gate address latch 232 and a select gate address predecoder 233.

The Y (column) address input buffer latch 218, the X (row) address latch 217 and the select gate address latch 232 latch addresses sent from the status register 207.

The latched addresses are predecoded by the Y (column) address predecoder 220, the X (row) address predecoder 219 and the select gate address predecoder 233, which output the predecoded results to a memory block array 231.

FIG. 8 also shows the structure of the memory block array 231 in the memory block 204. Referring to the drawing, reference numerals "221", "222", "223", "224", "225", "226", "227", "234", "228" and "229" respectively denote a memory block 0 of 8 KB, a memory block 1 of 32 KB, a memory block 2 of 32 KB, a memory block 3 of 32 KB, a memory block 4 of 32 KB, a sense amplifier/writing circuit, a selector circuit, a global bit line, a data bus DDB (15:0) and a block select signal.

Each memory block and the sense amplifier/writing circuit 226 are connected together by the global bit line 234.

Each memory block comprises an X decoder, an SG (Select Gate)/Y decoder and a memory cell array.

The sense amplifier/writing circuit 226 includes a path for sending the output of each memory block to the data bus via the global bit line 234 and the selector circuit 227 and a path for writing a value on the data bus to each memory block via the selector circuit 227, the sense amplifier/writing circuit 226 and the global bit line 234.

Figure 9:
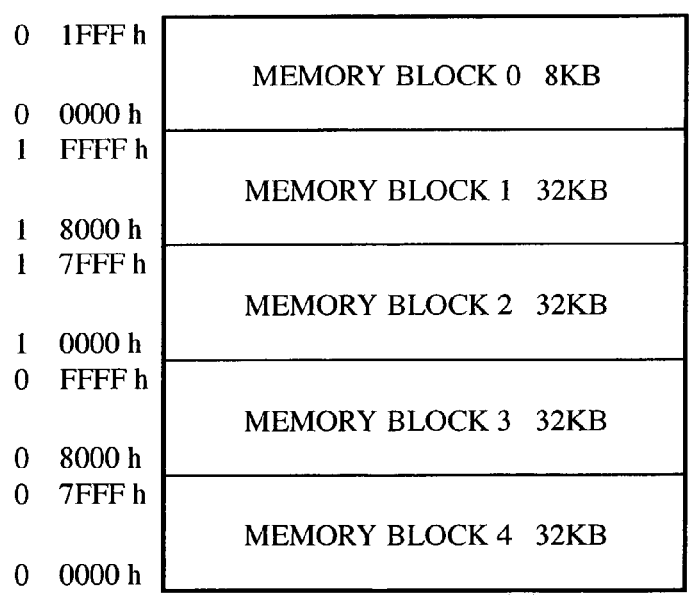
FIG. 9 is a diagram showing the address space of the memory block in the functional blocks shown in FIG. 4.

FIG. 9 shows the address space of the memory block 204.

The memory block 4 has the address space of "00000h" to "07FFFh" in hexadecimal notation.

The memory block 3 has the address space of "08000h" to "0FFFFh" in hexadecimal notation.

The memory block 2 has the address space of "10000h" to "17FFFh" in hexadecimal notation.

The memory block 1 has the address space of "18000h" to "1FFFFh" in hexadecimal notation.

The memory block 0 has the address space of "00000h" to "01FFFh" in hexadecimal notation.

Figure 10:
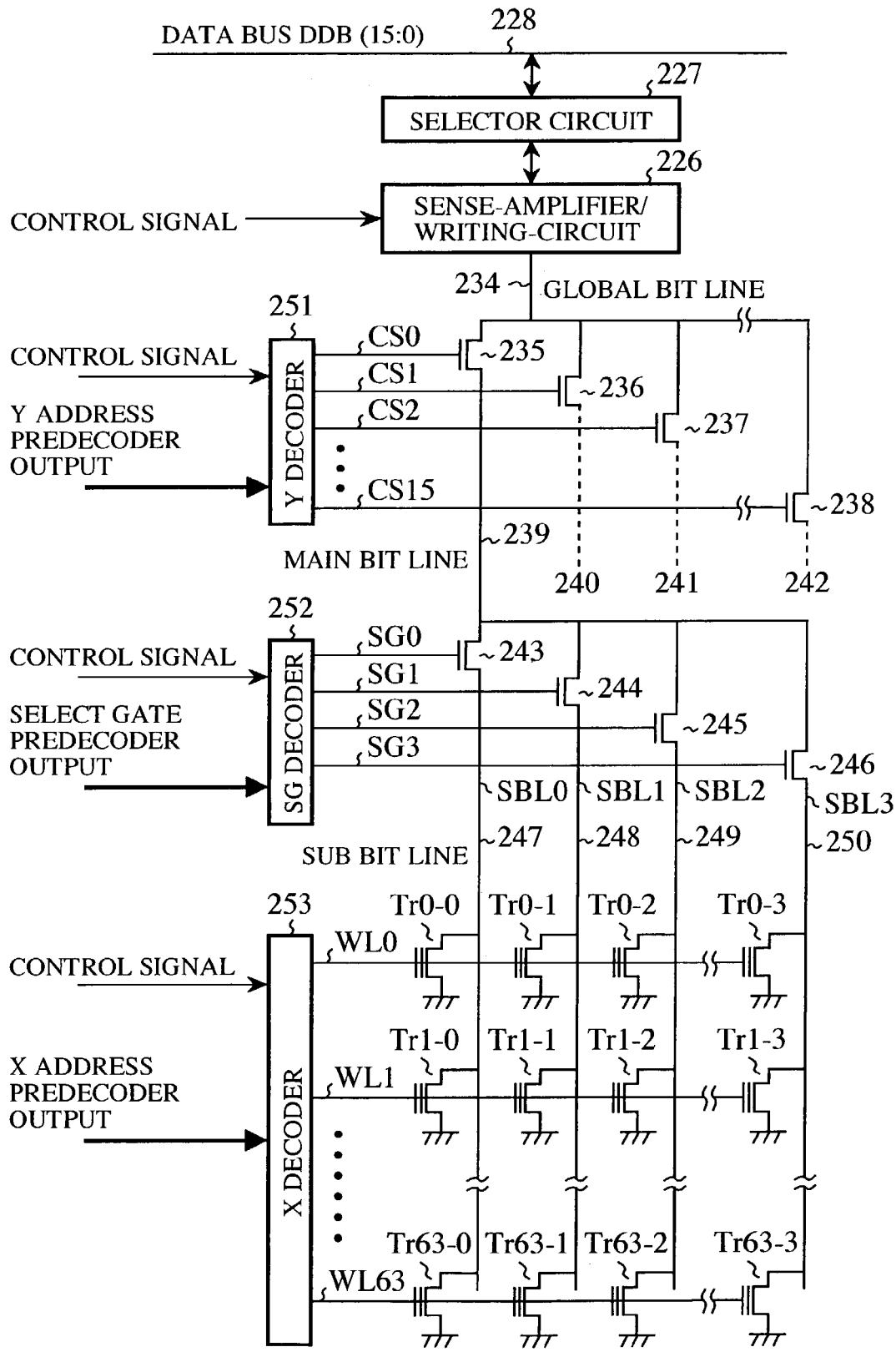
FIG. 10 is a diagram showing an X decoder, Y decoder, a memory cell array and a sense amplifier/writing circuit extracted from the blocks shown in FIG. 8.

FIG. 10 illustrates the structure of one of the memory blocks shown in FIG. 9 as an example. In the diagram, reference numerals "235 to 238", "239 to 242", "243 to 246", "251", "252" and "253" respectively denote transistors for selecting bit lines, main bit lines, transistors for selecting sub-bit lines, a Y decoder, an SG decoder and an X decoder. Reference symbols "CS0 to CS15" and "SG0 to SG3" denote control signals. Reference symbols "Tr0-0 to Tr63-0", "Tr0-1 to Tr63-1", "Tr0-2 to Tr63-2" and "Tr0-3 to Tr63-3" denote memory cells. The memory cell array illustrated is only coupled to a single main bit line.

Upon reception of the output of the Y address predecoder 220 (see FIG. 8), the Y decoder 251 generates the sixteen control signals CS0 to CS15 for selecting a single bit line from the sixteen main bit lines 239 to 242. The control signals CS0 to CS15 are connected to the gates of the transistors 235 to 238 which select the associated bit lines. Each of the main bit lines 239 to 242 is connected to four sub-bit lines.

Upon reception of the output of the select gate address predecoder 233 (see FIG. 8), the SG decoder 252 generates the control signals SG0 to SG3 for selecting a single sub-bit line from four sub-bit lines SBL0 to SBL3. The control signals SG0 to SG3 are connected to the gates of the transistors 243 to 246 which select the associated sub-bit lines.

Upon reception of the output of the X address predecoder 219, the X decoder 253 selectively controls a single word line from sixty-four word lines WL0 to WL63.

The memory cells Tr0-0 to Tr0-3, Tr1-0 to Tr1-3, ... and Tr63-0 to Tr63-3, which are comprised of non-volatile transistors having floating gates, are connected in a matrix form to the associated sub-bit lines.

The sub-bit lines SBL0 to SBL3 are connected to the source terminals of the respective columns of memory cells Tr0-0 to Tr63-0, Tr0-1 to Tr63-1, Tr0-2 to Tr63-2 and Tr0-3 to Tr63-3. The word lines WL0 to WL63 are respectively connected to the gate terminals of memory cells of each column.

Reading of memory data is carried out by selecting a single sub-bit line and a single word line respectively from the sub-bit lines SBL0 to SBL3 and the word lines WL0 to WL63 in accordance with the outputs of the X (row) address predecoder 219, the Y (column) address predecoder 220 and the select gate address predecoder 233 and outputting the contents of those memory cells, comprised of non-volatile transistors having floating gates, which are connected to the selected sub-bit line and word line, onto the data bus via a sense amplifier in the sense amplifier/writing circuit 226.

Writing of memory data is carried out by selecting a single sub-bit line and a single word line respectively from the sub-bit lines SBL0 to SBL3 and the word lines WL0 to WL63 in accordance with the outputs of the X (row) address predecoder 219, the Y (column) address predecoder 220 and the select gate address predecoder 233 (see FIG. 8) and writing a value on the data bus to those memory cells, comprised of non-volatile transistors having floating gates, which are connected to the selected sub-bit line and word line, via a writing circuit in the sense amplifier/writing circuit 226.

Erasure of memory data is carried out by applying an erase pulse to a memory block which is the target for erase and applying an erase voltage to the gates of the memory cells in that memory block which are comprised of non-volatile transistors having floating gates, thereby erasing the contents of the memory cells.

A description will now be given of the operation and advantages of the first embodiment of the invention.

Normally, in a single chip mode of a flash-memory incorporated microcomputer, the CPU/BIU 4 operates by reading a program code from the flash memory 2. During automatic erase, the flash memory 2 checks if erase has been executed properly using a reading circuit, such as a sense amplifier, in an erase-verify phase or the like, so that the flash memory 2 cannot perform normal reading of data from memory blocks other than the one during erasure. When an automatic erase command located in a program in the flash memory 2 is executed, therefore, the operation of the CPU should be halted so that the CPU does not attempt to read a program code from the flash memory 2 until the automatic erase sequence is completed. While the automatic erase command is being executed, the CPU hold control circuit 9 in the interface circuit 3 outputs the CPU hold signal 15, which causes the CPU/BIU 4 to stop all the bus accesses, and the CPU/BIU 4 stops bus accesses upon reception of the signal 15 (code fetch stop).

According to the conventional system, however, the microcomputer cannot operate during automatic erase which takes a maximum of about several seconds, so that even when an interruption or the like is generated, the microcomputer cannot accept it for several seconds. Therefore, interruption should be inhibited in a real system in some cases or the conventional system cannot be used in a system which essentially requires irregular interruption.

According to the first embodiment of the invention, when an interruption request 10 or 11 is generated from the peripheral unit 6 in the microcomputer or from the outside of the microcomputer while the CPU is being halted during the execution of the automatic erase, the interruption control circuit 5 accepts this interruption and sends the interrupt request signal 12 to the interface circuit 3 (see FIG. 1).

In the interface circuit 3, the interrupt request signal 12 becomes active while if the suspend enable register 8 is set in an enabled state, "1" is set in the suspend request register 7 whose output, the suspend request signal 13, becomes active (requesting state).

When receiving the suspend request, the flash memory 2 goes to a process of temporarily stopping the erase sequence. The operation of the flash memory 2 when the suspend mode becomes active during automatic erase will be elaborated later. It is not preferable to stop the erase sequence while a high load is applied to the memory cells, such as during application of the erase pulse, and it is desirable to stop the erase sequence at a point where the erase sequence can easily be resumed. In this respect, when the erase sequence proceeds to a haltable point after the suspend request signal 13 has been input, the erase sequence is temporarily halted. When this temporary halt is completed, the flash memory 2 can read other memory blocks than the one during erase and sends the suspend accept signal 14 to the interface circuit 3.

When the suspend accept signal 14 becomes active and the memory reading becomes enabled, the interface circuit 3 stops a bus access to the CPU/BIU 4. The interface circuit 3 disables the CPU hold signal 15 to release the operation of the CPU/BIU 4. The CPU/BIU 4 that has been released from the hold state can process an interruption routine according to the interruption request.

After the interruption process, to resume erasure, "0" is written in the suspend request register 7 by software. The suspend request signal 13 becomes inactive and the CPU hold signal 15 sets the CPU/BIU 4 in the hold state again. In the flash memory 2, after a process to resume the erase process is performed, the suspend accept signal 14 is set inactive and the erase process is resumed from the point where it was stopped.

Figure 3:
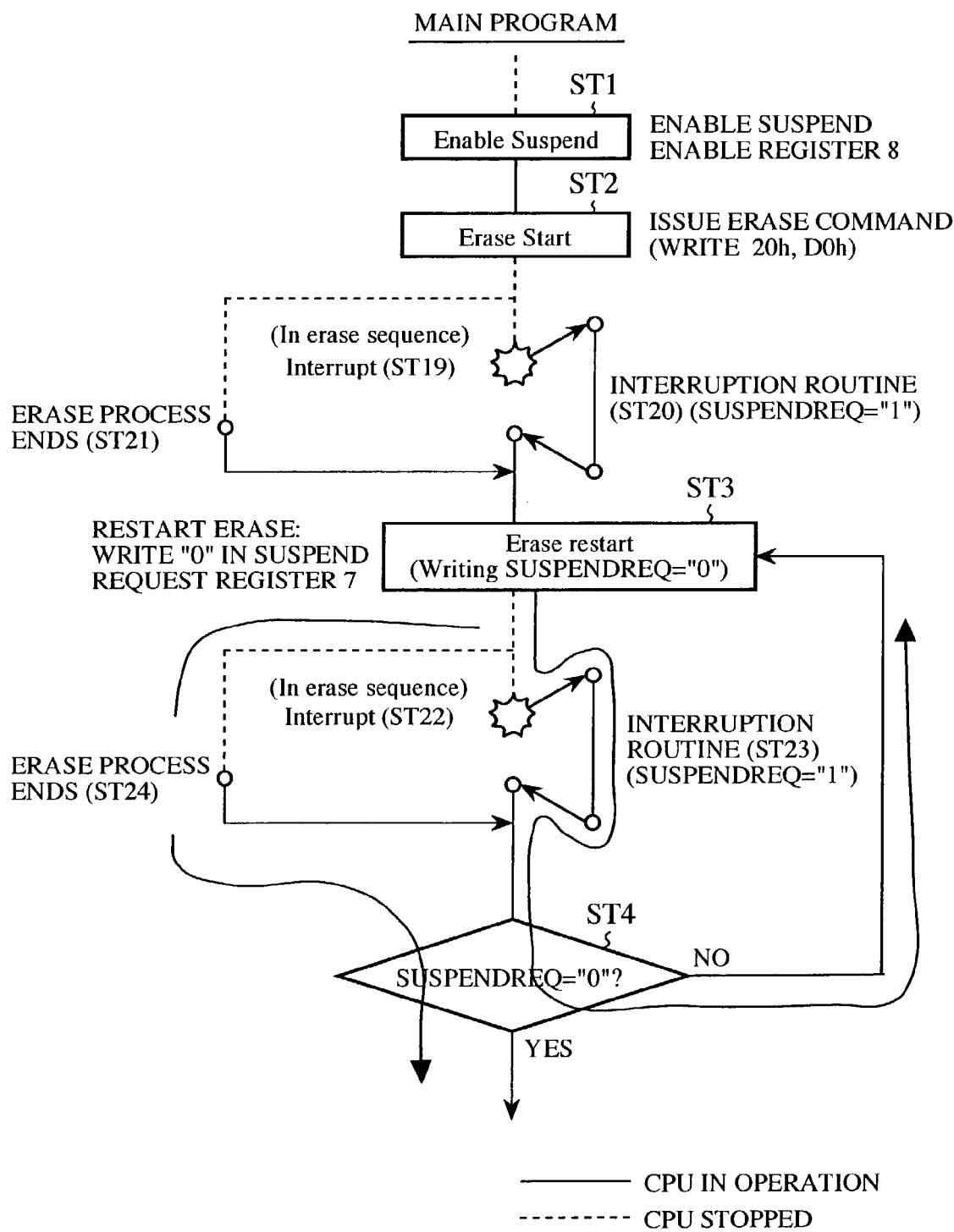
FIG. 3 is a diagram exemplifying a program flow of the microcomputer in accordance with the first embodiment of the invention.

FIG. 3 illustrates the general flow of the microcomputer program. Codes are described in the main program in the following four flows ① to ④.

① Write "1" in the suspend enable register 8 (step ST1) to set the suspend enable state.

② Issue an automatic erase command (sequentially write 20h and D0h) (step ST2)→start automatic erase.

③ Write "0" in the suspend request register 7 (step ST3)→resume halted automatic erase.

④ Determine whether the value of the suspend request register 7 is "0" or not (step ST4).

In case of "0", end.

In case of "1", return to ③ again.

When automatic erase is executed by this program, the flash memory 2 first executes ②, then enters the automatic erase operation and the CPU/BIU 4 is set in a bus-access inhibited state by the CPU hold signal 15. In a case where an interruption does not occur during that period of time, the automatic erase goes to the last step and the erase process ends (step ST21). Thereafter, while ③ and ④ are executed, the erase process ends there for the automatic erase of the flash memory 2 itself is finished. When an interruption occurs (step ST19), "1" is automatically set in the suspend request register 7, the CPU/BIU 4 is allowed to make a bus access when the flash memory 2 accepts this request, and the program jumps to an interruption routine (step ST20) to execute an interruption process. When the interruption routine (step ST20) is finished, the program returns to the main routine again and executes ③ to resume the automatic erase of the flash memory 2.

When the automatic erase of the flash memory 2 is resumed by the execution of ③, the CPU/BIU 4 is set again in a bus-access inhibited state. When an interruption does not occur during that period of time, the automatic erase goes to the last step and the erase process ends (step ST24) as done after the execution of ②. Thereafter, while ④ is executed, the erase process ends there for the automatic erase of the flash memory 2 itself is finished. When an interruption occurs again (step ST22), "1" is automatically set in the suspend request register 7 as done in the above-described case, the CPU/BIU 4 is allowed to make a bus access when the flash memory 2 accepts this request, and the program jumps to an interruption routine (step ST23) to execute an interruption process. When the interruption routine (step ST23) is finished, the program returns to the main routine again and executes ④. As an interruption has occurred and SUSPENDREQ="1" in this-case, the program returns to ③ to resume the automatic erase of the flash memory 2. Thereafter, ③ and ④ are repeated until the automatic erase of the flash memory 2 is completed.

Allowing the suspend request register 7 to function in the above-described operation facilitates the operations of temporarily stopping and resuming automatic erase.

As setting the suspend enable register 8 in a disabled state can inhibit the automatic erase from being temporarily stopped and resumed by interruption during the automatic erase, it is possible to cope with a case where erase is to be executed with the top priority, making the microcomputer easier to use by users.

Further, because writing to the suspend request bit is invalidated, it becomes easier to avoid the halting of automatic erase caused by malfunction of the CPU, such as runaway.

The detailed operation of the flash memory 2 will be given below.

(Automatic Collective Erase)

Figure 11:
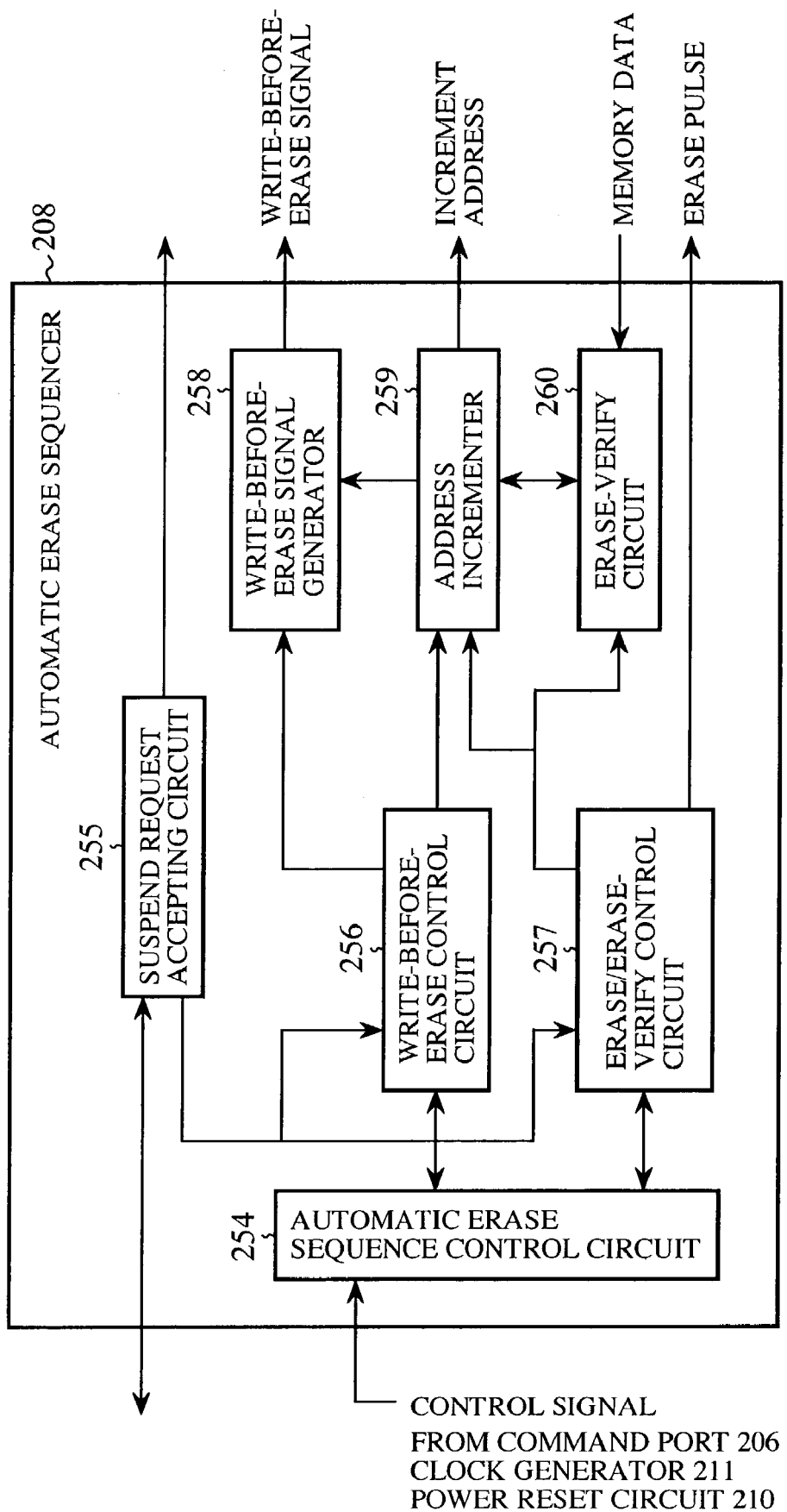
FIG. 11 is a diagram illustrating an automatic erase sequence.

The structure of the automatic erase sequencer 208 of the non-volatile semiconductor memory according to the first embodiment of the invention will be discussed below referring to FIG. 11. The automatic erase sequencer 208 includes an automatic erase sequence control circuit 254, a suspend request accepting circuit 255, a write-before-erase control circuit 256, an erase/erase-verify control circuit 257, a write-before-erase signal generator 258, an address incrementer 259 and an erase-verify circuit 260.

Upon reception of control signals from the command port 206 and the clock generator 211 (see FIG. 6), the automatic erase sequence control circuit 254 controls the automatic erase sequence control circuit 254, the write-before-erase control circuit 256 and the erase/erase-verify control circuit 257 when the non-volatile semiconductor memory according to the first embodiment of the invention enters the automatic erase mode.

Automatic erase performs a sequence of operations of address read, write-before-erase and erase/erase-verify in the units of separated memory blocks in the memory block 204.

Upon reception of a signal from the automatic erase sequence control circuit 254, the write-before-erase control circuit 256 performs a pre-erase writing process on a memory block. The write-before-erase control circuit 256 performs the process by causing the write-before-erase signal generator 258 to generate a write-before-erase signal while incrementing the address of the memory block which is subjected to erasure up to the highest address from the lowest address using the address incrementer 259.

The address incrementer 259 increments the address of the memory block which is subjected to erasure up to the highest address from the lowest address.

The erase/erase-verify control circuit 257 performs an erase and erase-verify process upon reception of a signal from the automatic erase sequence control circuit 254.

After the erase operation, the erase-verify circuit 260 compares the memory data with an expected read value and checks if the memory data has been erased. Reading the memory data is carried out sequentially by incrementing the address of the memory block which is subjected to erasure up to the highest address from the lowest address using the address incrementer 259.

The suspend request accepting circuit 255 accepts external an interruption sent via the suspend control circuit 305. The suspend request is sent to the write-before-erase control circuit 256 or the erase/erase-verify control circuit 257 and the automatic erase sequence is interrupted in accordance with the contents of the automatic erase process at the point of time when the suspend request has been made.

Figure 16:
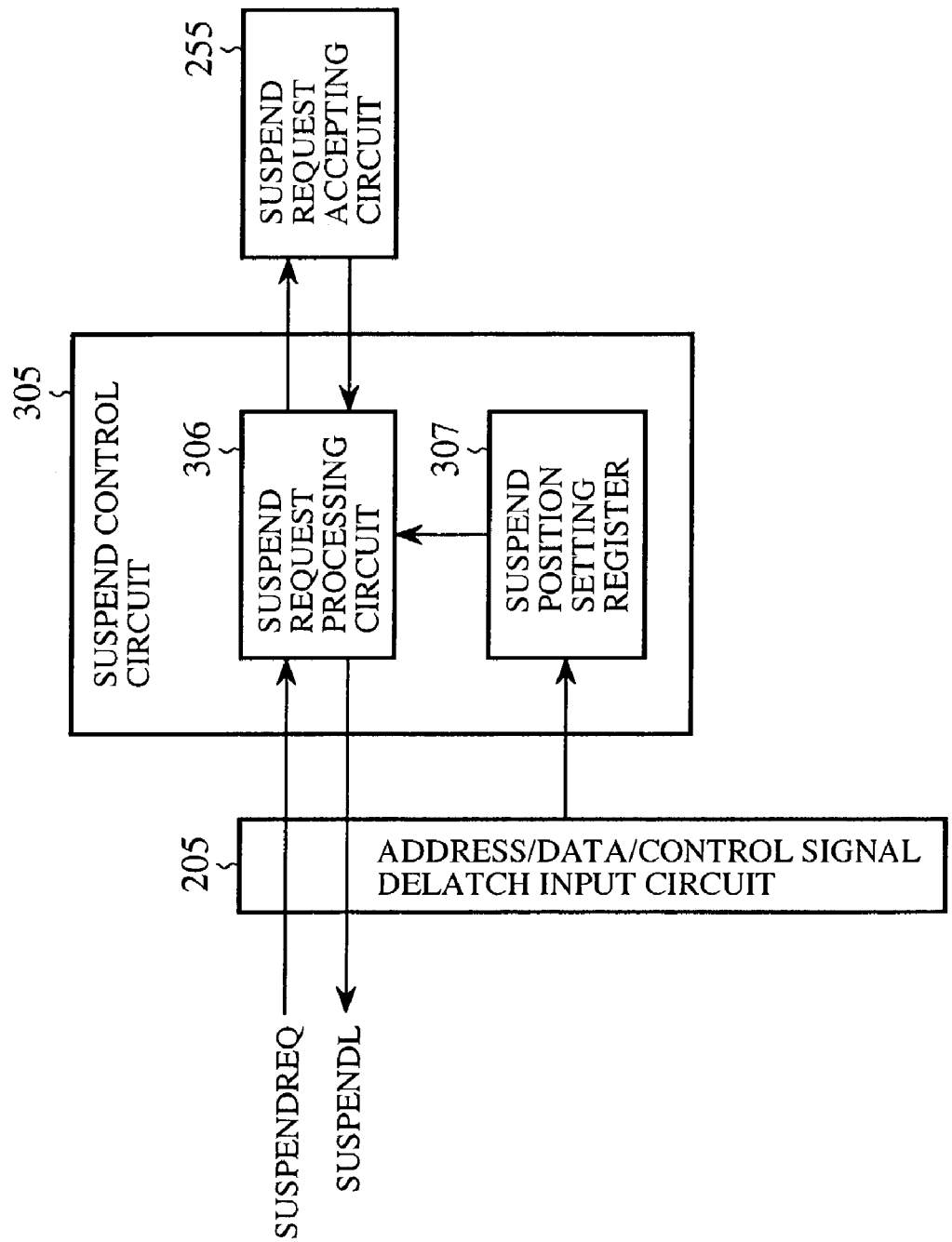
FIG. 16 is a diagram showing the structure of a suspend register.

FIG. 16 shows the structure of the suspend control circuit 305 in relation with the address/data/control signal delatch input circuit 205 and the suspend request accepting circuit 255. The suspend control circuit 305 is composed of a suspend request processing circuit 306 and a suspend position setting register 307.

When the suspend request signal (SUSPENDREQ) externally given via the address/data/control signal delatch input circuit 205 becomes an H level, the suspend request processing circuit 306 accepts the request and requests the suspend request accepting circuit 255 in the automatic erase sequencer 208 to interrupt the process.

When interruption of the automatic erase process starts, the suspend request accepting circuit 255 sends the suspend request processing circuit 306 a signal indicating that automatic erase being interrupted. The suspend request processing circuit 306 sets a signal (SUSPENDL) indicating the interruption of the process to an H level and sends the signal outside via the address/data/control signal delatch input circuit 205.

When the suspend request signal (SUSPENDREQ) goes to an L level, a request to release the suspend request is given to the suspend request accepting circuit 255 via the suspend request processing circuit 306.

When resuming of the automatic erase process starts, the suspend request accepting circuit 255 sends the suspend request processing circuit 306 a signal indicating that process is to be resumed. The suspend request processing circuit 306 sets the signal (SUSPENDL) indicating the interruption of the process to an L level and sends the signal outside via the address/data/control signal delatch input circuit 205.

The suspend position setting register 307 is a 2-bit register which can arbitrarily set an interruption point in the automatic erase process. Arbitrary data can be externally set into the suspend position setting register 307 via the address/data/control signal delatch input circuit 205.

Figure 17:
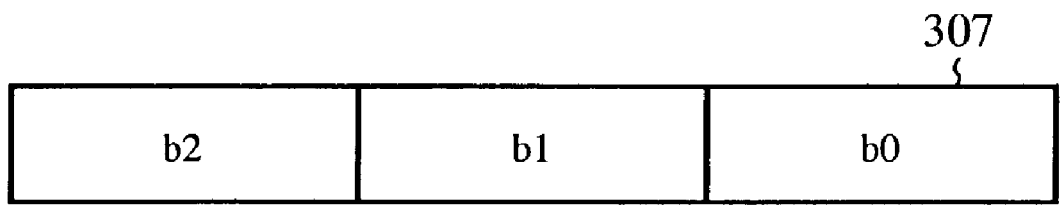
FIG. 17 is a diagram showing the structure of a suspend position setting register.

FIG. 17 shows what is set in the suspend position setting register 307. b0 is a bit which executes suspend after write-before-erase in the automatic erase sequence is finished. With b0=1, the suspend process is executed after completion of write-before-erase. With b0=0, the suspend process is not carried out.

b1 is a bit which executes suspend after application of the erase pulse in the automatic erase sequence is done. With b1=1, the suspend process is executed after application of the erase pulse. With b1=0, the suspend process is not carried out.

b2 is a bit which executes suspend after application of the write pulse in the automatic write sequence is done. With b2=1, the suspend process is executed after application of the write pulse. With b2=0, the suspend process is not carried out.

Provided that an arbitrary suspend position is set in the suspend position setting register 307, automatic erase can be suspended according to the set contents of the register 307 even if the suspend request signal (SUSPENDREQ) is not set to an H level via the address/data/control signal delatch input circuit 205.

As a process can be stopped at any designated position in the automatic write sequence and automatic erase sequence of the flash memory 2, it is possible to facilitate analysis of inadequate erasure, such as a check on the transition of Vth of the memory cells in the automatic erase sequence, which could not be checked conventionally.

Figure 12:
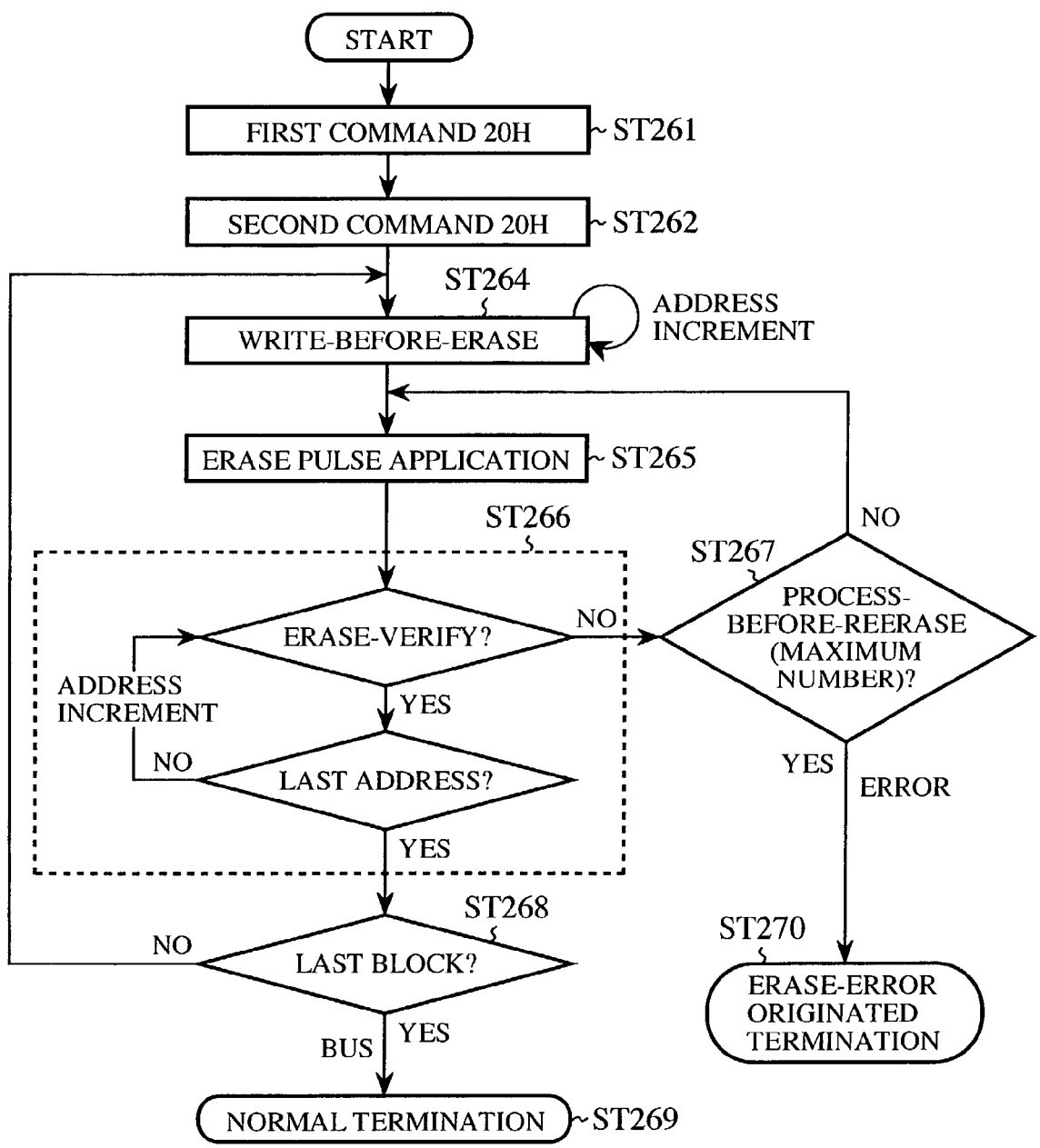
FIG. 12 is a flowchart illustrating an automatic collective erase sequence.

The operation of automatic collective erase of the nonvolatile semiconductor memory according to the first embodiment of the invention in the case of no suspend request made will now be discussed referring to a flowchart in FIG. 12.

In the automatic collective erase in this case, all of the block 1, block 2, block 3 and block 4 are subject to erasure.

First, in the automatic collective erase, the operation enters the setup mode in response to the first command 20H input from the data D (15:0) bus (step ST261) and enters the automatic collective erase mode in response to the verify command or the second command 20H in the next cycle (step ST262).

In a write-before-erase phase (step ST264), the automatic erase sequencer 208 performs an operation to write data "1" to the memory block that is to be erased. In the write-before-erase phase (step ST264), the data is written word by word while sequentially incrementing the address by using the address incrementer 259. After the write-before-erase phase (step ST264) ends, the process proceeds to an erase pulse application phase (step ST265).

In the erase pulse application phase (step ST265), the erase pulse is applied only to the memory block that is to be erased to execute the erase operation. After the erase pulse application phase (step ST265) ends, the process proceeds to an erase-verify phase (step ST266).

In the erase-verify phase (step ST266), an erase-verify process is performed on the memory block that is to be erased while incrementing the address up to the highest address from the lowest address. When a verify failure occurs in the erase-verify phase (step ST266), the process proceeds to a process-before-reerase phase (step ST267) to execute erasure again. In the process-before-reerase phase (step ST267), the counter value indicating the number of times the process-before-reerase has been executed is incremented by "1" and the process proceeds again to the erase pulse application phase (step ST265).

In the erase pulse application phase (step ST265), the erase operation is performed again. After the erase pulse application phase (step ST265) ends, the process proceeds to the erase-verify phase (step ST266). In the erase-verify phase (step ST266), verify is started again at the address where the previous erase-verify failed. In the erase pulse application phase (step ST265), the erase-verify phase (step ST266) and the process-before-reerase phase (step ST267), loop processes are continued until the last address is verified in the erase-verify phase (step ST266) or until the counter value indicating the number of times the process-before-reerase has been executed reaches a maximum value in the process-before-reerase phase (step ST267). When the counter value indicating the number of times the process-before-reerase has been executed reaches the maximum value in the process-before-reerase phase (step ST267), the process is terminated as erase-error originated termination (step ST270).

When the verify process passes, the process proceeds to a last block checking phase (step ST268). In the last block checking phase (step ST268), when there still is a memory block to be erased, the process proceeds again to the write-before-erase phase (step ST264) to execute pre-erase writing to the next memory block. When it is confirmed that the memory block is the last one, the automatic erase process is terminated as normal termination (step ST269).

Figure 15:
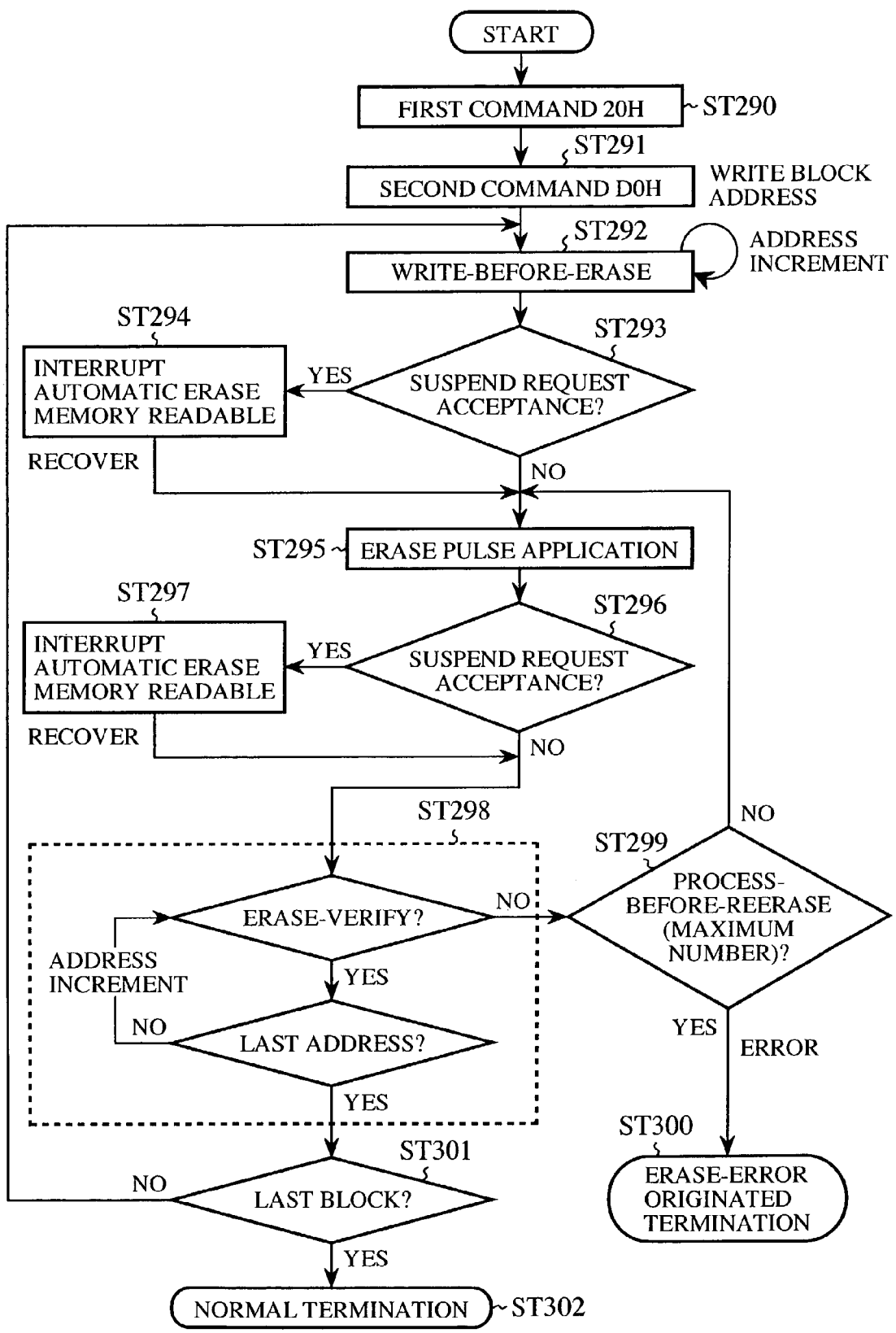
FIG. 15 is a flowchart illustrating an automatic collective erase sequence which has an automatic erase interruption.

The operation of automatic collective erase of the nonvolatile semiconductor memory according to the first embodiment of the invention in case of a suspend request made will now be discussed referring to a flowchart in FIG. 15.

In the automatic collective erase in this case, all of the block 1, block 2, block 3 and block 4 are subject to erasure.

First, in the automatic block or collective erase, the operation enters the setup mode in response to the first command 20H input from the data D (15:0) bus (step ST290) and enters the automatic collective erase mode in response to the verify command or the second command D0H in the next cycle (step ST291).

In the next write-before-erase phase (step ST292), the automatic erase sequencer 208 performs an operation to write data "1" to the memory block that is to be erased. In the write-before-erase phase (step ST292), the data is written word by word while sequentially incrementing the address by using the address incrementer 259. After the write-before-erase phase (step ST292) ends, the process proceeds to an erase pulse application phase (step ST295) when there is no suspend request.

In a case where a suspend request is made or "1" is set in b0 of the suspend position setting register 307 during a period from the acceptance of the first command 20H (step ST290) to the write-before-erase phase (step ST292), the automatic erase process is not interrupted until the write-before-erase phase (step ST292) ends. After the write-before-erase phase (step ST292) ends, interruption of automatic erase (step ST294) is performed to permit memory data to be read out when there is a suspend request in a suspend request acceptance phase (step ST293). When there is no suspend request, the process proceeds to the next erase pulse application phase (step ST295). Even when the process is recovered after acceptance of the suspend request, the process proceeds to the next erase pulse application phase (step ST295).

In the erase pulse application phase (step ST295), the erase pulse is applied only to the memory block that is to be erased to execute the erase operation. After the erase pulse application phase (step ST295) ends, the process proceeds to an erase-verify phase (step ST298) when there is no suspend request.

In a case where a suspend request is made during the erase pulse application phase (step ST295), the automatic erase process is not interrupted until the erase pulse application phase (step ST295) ends. After the erase pulse application phase (step ST295) ends, interruption of automatic erase (step ST297) is performed to permit memory data to be read out when there is a suspend request in a suspend request acceptance phase (step ST296). When there is no suspend request, the process proceeds to the next erase-verify phase (step ST298). Even when the process is recovered after acceptance of the suspend request, the process proceeds to the next erase-verify phase (step ST298)

In the erase-verify phase (step ST298), an erase-verify process is performed on the memory block that is to be erased while incrementing the address up to the highest address from the lowest address. When a verify failure occurs in the erase-verify phase (step ST298), the process proceeds to a process-before-reerase phase (step ST299) to execute erasure again. In the process-before-reerase phase (step ST299), the counter value indicating the number of times the process-before-reerase has been executed is incremented by "1" and the process proceeds again to the erase pulse application phase (step ST295).

In the erase pulse application phase (step ST295), the erase operation is performed again. After the erase pulse application phase (step ST295) ends, the process proceeds to the erase-verify phase (step ST298).

In a case where a suspend request is made or "1" is set in b1 in the suspend position setting register 307 during the erase-verify phase (step ST298) and the erase pulse application phase (step ST295), the automatic erase process is not interrupted until the erase pulse application phase (step ST295) ends. After the erase pulse application phase (step ST295) ends, interruption of automatic erase (step ST297) is performed to permit memory data to be read out when there is a suspend request in the suspend request acceptance phase (step ST296). When there is no suspend request, the process proceeds to the next erase-verify phase (step ST298). Even when the process is recovered after acceptance of the suspend request, the process proceeds to the next erase-verify phase (step ST298).

In the erase-verify phase (step ST298), verify is started again at the address where the previous erase-verify failed. In the erase pulse application phase (step ST295), erase-verify phase (step ST298) and the process-before-reerase phase (step ST299), loop processes are continued until the last address is verified in the erase-verify phase (step ST298) or until the counter value indicating the number of times the process-before-reerase has been executed reaches a maximum value in the process-before-reerase phase (step ST299). When the counter value indicating the number of times the process-before-reerase has been executed reaches the maximum value in the process-before-reerase phase (step ST299), the process is terminated as erase-error originated termination (step ST300).

When the verify process passes, the process proceeds to a last block checking phase (step ST301). In the last block checking phase (step ST301), when there still is a memory block to be erased, the process proceeds again to the write-before-erase phase (step ST292) to execute pre-erase writing to the next memory block. When it is confirmed that the memory block is the last one, the automatic erase process is terminated as normal termination (step ST302).

In a case where a suspend request is made or "1" is set in b0 in the suspend position setting register 307 during the erase-verify phase (step ST298) and the write-before-erase phase (step ST292), the automatic erase process is not interrupted until the write-before-erase phase (step ST292) ends. After the write-before-erase phase (step ST292) ends, interruption of automatic erase (step ST294) is performed to permit memory data to be read out when there is a suspend request in the suspend request acceptance phase (step ST293). When there is no suspend request, the process proceeds to the next erase pulse application phase (step ST295). Even when the process is recovered after acceptance of the suspend request, the process proceeds to the next erase pulse application phase (step ST295).

Figure 13:
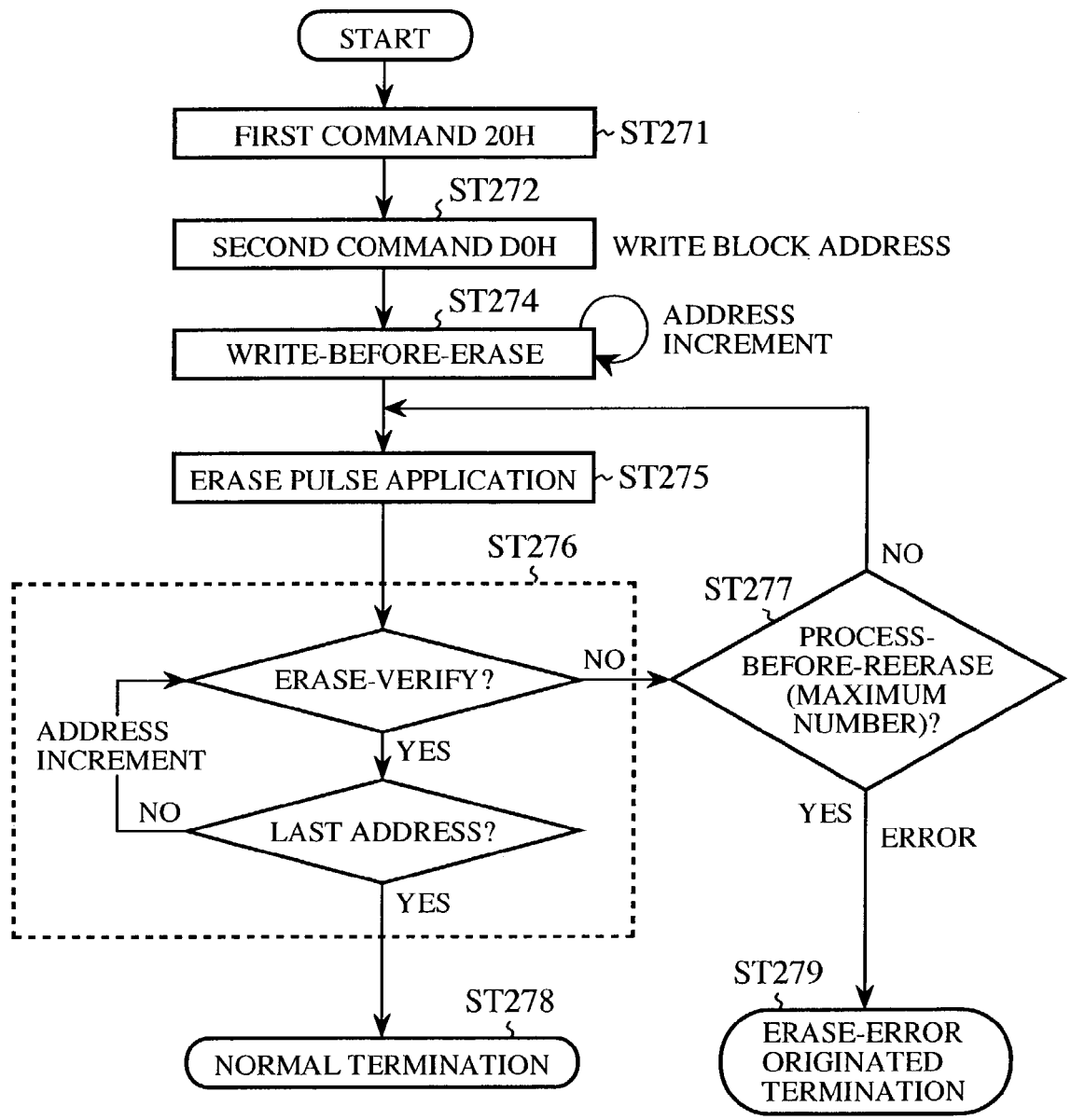
FIG. 13 is a flowchart illustrating an automatic block erase sequence.

Referring to a flowchart in FIG. 13, a description will now be given of the operation of automatic block erase of the non-volatile semiconductor memory according to the first embodiment of the invention, targeting any one of the block 1, block 2, block 3 and block 4 in a case where there is no suspend request made.

In the automatic block erase in this case, all of the block 1, block 2, block 3 and block 4 are subject to erasure.

First, in the automatic block erase, the operation enters the setup mode in response to the first command 20H input from the data D (15:0) bus (step ST271) and enters the automatic collective erase mode in response to the verify command or the second command D0H in the next cycle (step ST272). At the time the second command D0H is input (step ST272), the block address of the memory block that is to be erased is read.

In a write-before-erase phase (step ST274), the automatic erase sequencer 208 performs an operation to write data "1" to the memory block that is to be erased. In the write-before-erase phase (step ST274), the data is written word by word while sequentially incrementing the address by using the address incrementer 259. After the write-before-erase phase (step ST274) ends, the process proceeds to an erase pulse application phase (step ST275).

In the erase pulse application phase (step ST275), the erase pulse is applied to the memory block that is to be erased to execute the erase operation. After the erase pulse application phase (step ST275) ends, the process proceeds to an erase-verify phase (step ST276).

In the erase-verify phase (step ST276), an erase-verify process is performed on the memory block that is to be erased while incrementing the address up to the highest address from the lowest address. When a verify failure occurs in the erase-verify phase (step ST276), the process proceeds to a process-before-reerase phase (step ST277) to execute erasure again. In the process-before-reerase phase (step ST277), the counter value indicating the number of times the process-before-reerase has been executed is incremented by "1" and the process proceeds again to the erase pulse application phase (step ST275).

In the erase pulse application phase (step ST275), the erase operation is performed again. After the erase pulse application phase (step ST275) ends, the process proceeds to the erase-verify phase (step ST276). In the erase-verify phase (step ST276), verify is started again at the address where the previous erase-verify failed. In the erase pulse application phase (step ST275), the erase-verify phase (step ST276) and the process-before-reerase phase (step ST277), loop processes are continued until the last address is verified in the erase-verify phase (step ST276) or until the counter value indicating the number of times the process-before-reerase has been executed reaches a maximum value in the process-before-reerase phase (step ST277). When the counter value indicating the number of times the process-before-reerase has been executed reaches the maximum value in the process-before-reerase phase (step ST277), the process is terminated as erase-error originated termination (step ST279).

When the verify process passes, the first automatic block process is terminated as normal termination (step ST278).

Figure 14:
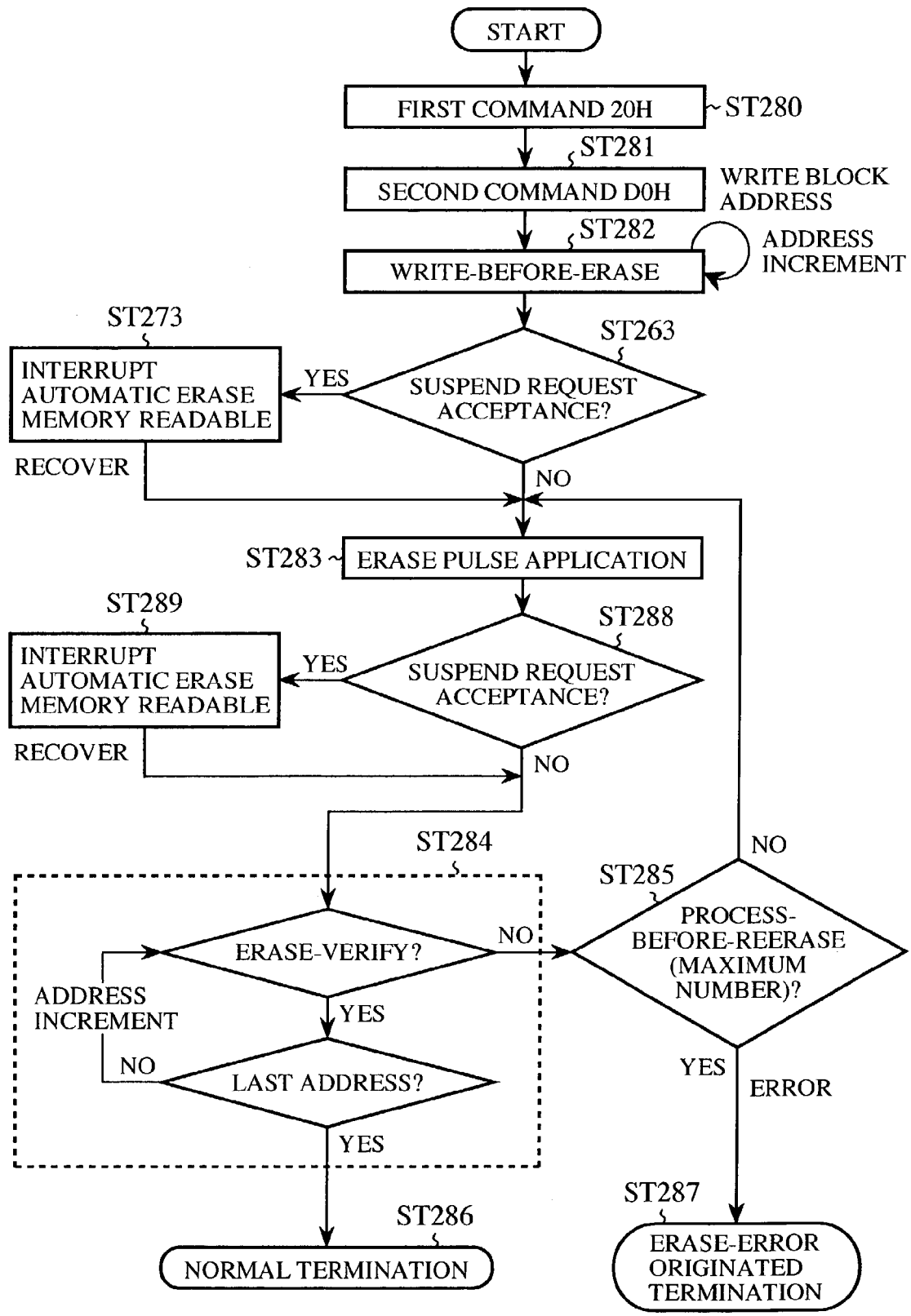
FIG. 14 is a flowchart illustrating an automatic block erase sequence which has an automatic erase interruption.

Referring to a flowchart in FIG. 14, a description will now be given of the operation of automatic block erase of the non-volatile semiconductor memory according to the first embodiment of the invention, targeting any one of the block 1, block 2, block 3 and block 4 in a case where there is a suspend request.

First, in the automatic collective erase, the operation enters the setup mode in response to the first command 20H input from the data D (15:0) bus (step ST280) and enters the automatic collective erase mode in response to the verify command or the second command D0H in the next cycle (step ST281). At the time the second command D0H is input (step ST281), the block address of the memory block that is to be erased is read.

In the next write-before-erase phase (step ST282), the automatic erase sequencer 208 performs an operation to write data "1" to the memory block that is to be erased. In the write-before-erase phase (step ST282), the data is written word by word while sequentially incrementing the address by using the address incrementer 259. After the write-before-erase phase (step ST282) ends, the process proceeds to an erase pulse application phase (step ST283) when there is no suspend request.

In a case where a suspend request is made or "1" is set in b0 of the suspend position setting register 307 during a period from the acceptance of the first command 20H (step ST280) to the write-before-erase phase (step ST282), the automatic erase process is not interrupted until the write-before-erase phase (step ST282) ends. After the write-before-erase phase (step ST282) ends, interruption of automatic erase (step ST273) is performed to permit memory data to be read out when there is a suspend request in a suspend request acceptance phase (step ST263). When there is no suspend request, the process proceeds to the next erase pulse application phase (step ST283). Even when the process is recovered after acceptance of the suspend request, the process proceeds to the next erase pulse application phase (step ST283).

In the erase pulse application phase (step ST283), the erase pulse is applied only to the memory block that is to be erased to execute the erase operation. After the erase pulse application phase (step ST283) ends, the process proceeds to an erase-verify phase (step ST284) when there is no suspend request.

In a case where a suspend request is made or "1" is set in b1 in the suspend position setting register 307 during the erase pulse application phase (step ST283), the automatic erase process is not interrupted until the erase pulse application phase (step ST283) ends. After the erase pulse application phase (step ST283) ends, interruption of automatic erase (step ST289) is performed to permit memory data to be read out when there is a suspend request in a suspend request acceptance phase (step ST288). When there is no suspend request, the process proceeds to the next erase-verify phase (step ST284). Even when the process is recovered after acceptance of the suspend request, the process proceeds to the next erase-verify phase (step ST284).

In the erase-verify phase (step ST284), an erase-verify process is performed on the memory block that is to be erased while incrementing the address up to the highest address from the lowest address. When a verify failure occurs in the erase-verify phase (step ST284), the process proceeds to a process-before-reerase phase (step ST285) to execute erasure again. In the process-before-reerase phase (step ST285), the counter value indicating the number of times the process-before-reerase has been executed is incremented by "1" and the process proceeds again to the erase pulse application phase (step ST283).

In the erase pulse application phase (step ST283), the erase operation is performed again. After the erase pulse application phase (step ST283) ends, the process proceeds to the erase-verify phase (step ST284).

In a case where a suspend request is made or "1" is set in b1 in the suspend position setting register 307 during the erase-verify phase (step ST284) and the erase pulse application phase (step ST283), the automatic erase process is not interrupted until the erase pulse application phase (step ST283) ends. After the erase pulse application phase (step ST283) ends, interruption of automatic erase (step ST289) is performed to permit memory data to be read out when there is a suspend request in the suspend request acceptance phase (step ST288). When there is no suspend request, the process proceeds to the next erase-verify phase (step ST284). Even when the process is recovered after acceptance of the suspend request, the process proceeds to the next erase-verify phase (step ST284).

In the erase-verify phase (step ST284), verify is started again at the address where the previous erase-verify failed. In the erase pulse application phase (step ST283), the erase-verify phase (step ST284) and the process-before-reerase phase (step ST285), loop processes are continued until the last address is verified in the erase-verify phase (step ST284) or until the counter value indicating the number of times the process-before-reerase has been executed reaches a maximum value in the process-before-reerase phase (step ST285). When the counter value indicating the number of times the process-before-reerase has been executed reaches the maximum value in the process-before-reerase phase (step ST285), the process is terminated as erase-error originated termination (step ST287).

When the verify process passes, the automatic erase process is terminated as normal termination (step ST286).

Figure 18:
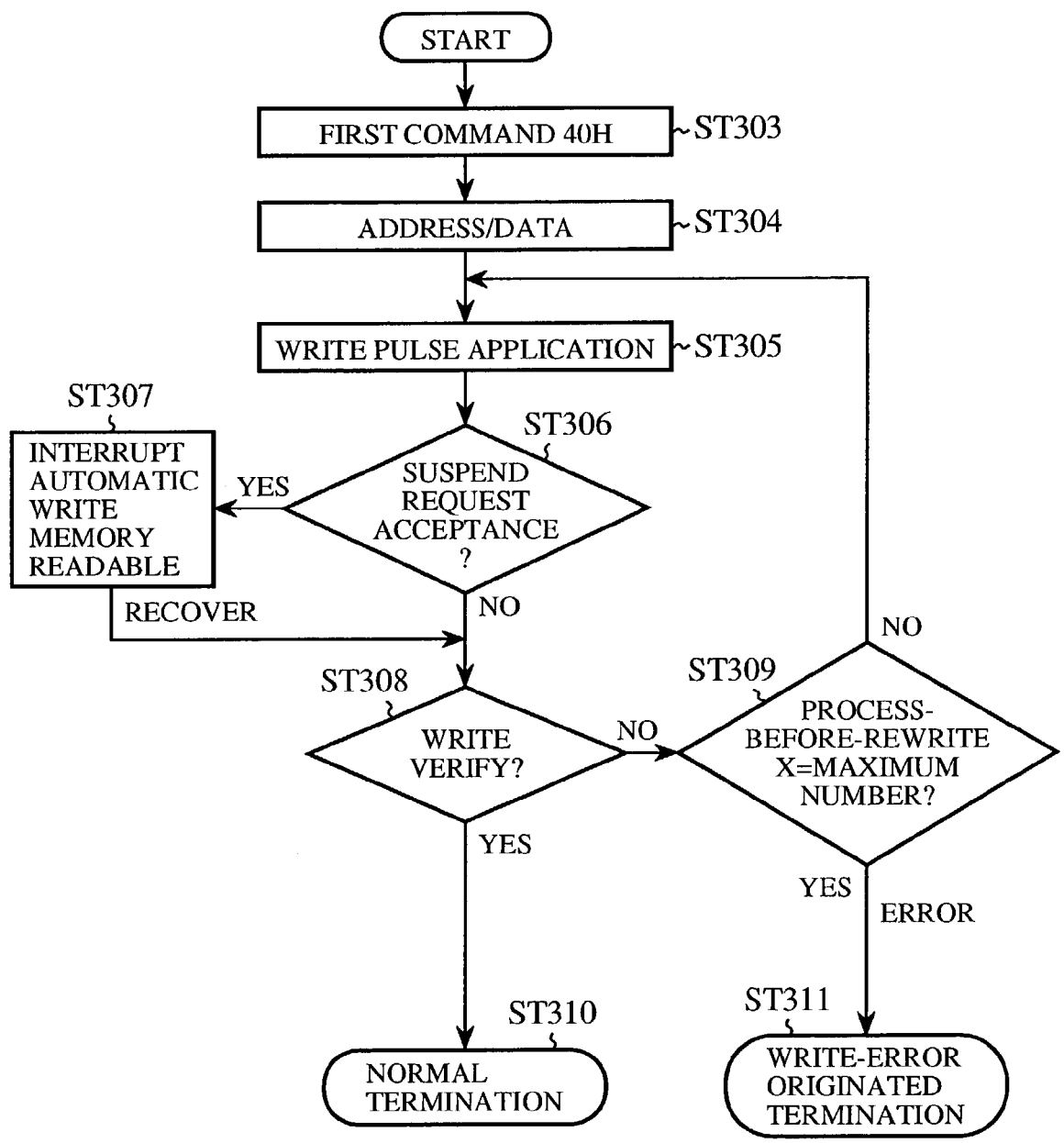
FIG. 18 is a flowchart illustrating an automatic write sequence.

The automatic writing operation of the non-volatile semiconductor memory according to the invention will now be discussed referring to a flowchart in FIG. 18.

First, in the automatic write, the operation enters the setup mode in response to the first command 40H input from the data D (15:0) bus (step ST303) and acquires write data and a write address to enter the automatic write mode in the next cycle (step ST304).

In a write pulse application phase (step ST305), a write pulse is applied according to the acquired write address and data.

After the write pulse is applied, interruption of automatic write (step ST307) is performed to permit memory data to be read out when there is a suspend request in a suspend request acceptance phase (step ST306). When there is no suspend request, the process proceeds to the next write verify phase (step ST308).

In the write verify phase (step ST308), after application of the write pulse, the data at the address where writing has been done is read out and compared with externally acquired data.

The comparison is carried out word by word. If there is a mismatch of even one bit in the comparison, the process proceeds to a re-pre-write process (step ST309) to retry writing. When all data has a match in the comparison, the process is terminated as normal termination (step ST310). In the re-pre-write process (step ST309), the value of the counter which counts the number of writing actions is incremented by "+1".

Further, the process proceeds to the write pulse application phase (step ST305) to specify any bit which has failed writing and apply the write pulse again. When the counter value reaches a maximum number of writing actions, the process is terminated as a write error (step ST311).

According to the first embodiment, as described above, when there is a process interruption command issued externally during automatic erase of the non-volatile semiconductor memory, the individual automatic erase flows can interrupt an erase process and resume automatic erase of the non-volatile semiconductor memory after reading out memory data.

When there is a process interruption command issued externally during automatic block erase of the non-volatile semiconductor memory, the automatic block erase can be carried out by interrupting an erase process, reading memory data and then resuming automatic erase of the non-volatile semiconductor memory.

When there is a process interruption command issued externally during automatic collective erase of the non-volatile semiconductor memory, the automatic collective erase can be carried out by interrupting an erase process, reading memory data and then resuming automatic erase of the non-volatile semiconductor memory.

This brings about such an advantage that even in a case where it becomes necessary to read memory data during execution of automatic collective erase or automatic block erase of the non-volatile semiconductor memory, it is unnecessary to wait for the erase process to end or to enable resetting.

As compared with the aforementioned JP-A 02-257496 (1990), the flash-memory incorporated microcomputer according to the first embodiment of the invention is characterized that to simplify the circuit structure, an erase process or the like is not interrupted even an interruption request is made at the time of applying the voltage VPP and is continued until a preset interruptible point is reached. That is, several interruptible points are set in the erase sequence beforehand and interruption becomes possible only when the process reaches any of the interruptible points.

Although this design takes more time than the prior art from the point of the generation of an interruption request to the actual execution of interruption, the interrupted point can be known as data of several bits because of the finite number of interruptible points, at the time of reading information indicating where interruption has been made using the unique function of the invention. This feature is effective in analysis of problems. For the same reason given above, an interruptible point can be designed by writing data of several bits.

The features of the interruptible flash memory according to the invention lies in that it is equipped with a sequencer (control circuit) which has the following capabilities:

(1) capability to temporarily interrupt and restart an erase process by a request from the external of the flash memory, (2) capability to know where interruption has occurred, and (3) capability to designate an interrupting point by writing information indicating the point in the associated register.

The sequencer improves the usability of the microcomputer by users and improves the analytical performance.

What is claimed is:

1. A microcomputer comprising:
   at least a CPU capable of executing an automatic erase sequence and an automatic write sequence, provided in said microcomputer;
   a non-volatile memory whose automatic erase and automatic writing can be interrupted under external control of the non-volatile memory;
   a peripheral device; and
   a register having a capability of switching between enabling and disabling of a capability of interrupting automatic erase and automatic writing,
   wherein said automatic erase or automatic writing of said non-volatile memory is temporarily interrupted in response to an interruption request from said peripheral device or outside, so that said CPU can read data from said non-volatile memory.

2. A microcomputer comprising:
   at least a CPU capable of executing an automatic erase sequence and an automatic write sequence, provided in said microcomputer;
   a non-volatile memory whose automatic erase and automatic writing can be interrupted under external control of the non-volatile memory;
   a peripheral device;
   wherein said automatic erase or automatic writing of said non-volatile memory is temporarily interrupted in response to an interruption request from said peripheral device or outside, so that said CPU can read data from said non-volatile memory, wherein said non-volatile memory constitutes a block memory array with a plurality of memory blocks each having a memory array having a matrix of memory cells comprised of non-volatile transistors, and further comprising:
   interruption means for interrupting write and erase processes after each phase in a process sequence;
   means for interrupting a process upon occurrence of a first interruption for interrupting write and erase processes in a phase corresponding to a timing at which said first interruption is made in said process sequence and interrupting a process upon occurrence of a second interruption for interrupting said write and erase processes in a specific phase in said process sequence; and
   an erase system for erasing one block memory depending on whether there is said first interruption or said second interruption for interrupting said erase process.

3. A microcomputer comprising:
   at least a CPU capable of executing an automatic erase sequence and an automatic write sequence, provided in said microcomputer;
   a non-volatile memory whose automatic erase and automatic writing can be interrupted under external control of the non-volatile memory;
   a peripheral device;
   wherein said automatic erase or automatic writing of said non-volatile memory is temporarily interrupted in response to an interruption reguest from said peripheral device or outside, so that said CPU can read data from said non-volatile memory, wherein said non-volatile memory constitutes a block memory array with a plurality of memory blocks each having a memory array having a matrix of memory cells comprised of non-volatile transistors, and further comprising:

interruption means for interrupting write and erase processes after each phase in a process sequence;

means for interrupting a process upon occurrence of a first interruption for interrupting write and erase processes in a phase corresponding to a timing at which said first interruption is made in said process sequence and interrupting a process upon occurrence of a second interruption for interrupting said write and erase processes in a specific phase in said process sequence; and an erase system for entirely erasing said block memory array depending on whether there is said first interruption or said second interruption for interrupting said erase process.

4. A microcomputer comprising:

at least a CPU capable of executing an automatic erase sequence and an automatic write sequence, provided in said microcomputer;

a non-volatile memory whose automatic erase and automatic writing can be interrupted under external control of the non-volatile memory;

a peripheral device;

automatic erase and write means interruptible and resumable in response to an external input; and a circuit for outputting information indicating a place of interruption in said automatic erase sequence or said automatic write sequence, as data of several bits, when said automatic erase sequence or said automatic write sequence is interrupted, whereby said CPU or a tester can read said information, wherein said automatic erase or automatic writing of said non-volatile memory is temporarily interrupted in response to an interruption request from said peripheral device or outside, so that said CPU can read data from said non-volatile memory.

5. A microcomputer comprising:

at least a CPU capable of executing an automatic erase sequence and an automatic write sequence, provided in said microcomputer;

a non-volatile memory whose automatic erase and automatic writing can be interrupted under external control of the non-volatile memory;

a peripheral device;

automatic erase and write means interruptible and resumable in response to an external input; and a circuit capable of allowing said CPU or a tester to designate information indicating a probable place of interruption in said automatic erase sequence or said automatic write sequence, as data of several bits, before execution of said automatic erase sequence or said automatic write sequences, wherein said automatic erase or automatic writing of said non-volatile memory is temporarily interrupted in response to an interruption request from said peripheral device or outside, so that said CPU can read data from said non-volatile memory.

* * * * *